(12) United States Patent
Jones et al.

(10) Patent No.: US 8,785,843 B2
(45) Date of Patent: Jul. 22, 2014

(54) MASS SPECTROMETER SAMPLING CONE WITH COATING

(71) Applicant: Micromass UK Limited, Manchester (GB)

(72) Inventors: Gordon A. Jones, Lancashire (GB); David S. Douce, Cheshire (GB); Amir Farooq, Oldham (GB)

(73) Assignee: Micromass UK Limited, Wilmslow (GB)

( * ) Notice: Subject to any disclaimer, the term of this patent is extended or adjusted under 35 U.S.C. 154(b) by 0 days.

(21) Appl. No.: 13/922,681

(22) Filed: Jun. 20, 2013

(65) Prior Publication Data
US 2013/0277550 A1 Oct. 24, 2013

Related U.S. Application Data

(63) Continuation of application No. 13/294,650, filed on Nov. 11, 2011, now Pat. No. 8,471,198, which is a continuation-in-part of application No. PCT/GB2010/000967, filed on May 13, 2010, application No. 13/922,681, which is a continuation-in-part of application No. PCT/GB2010/000965, filed on May 13, 2010, and a continuation-in-part of application No. PCT/GB2010/000956, filed on May 13, 2010, and a continuation-in-part of application No. PCT/GB2010/000957, filed on May 13, 2009.

(60) Provisional application No. 61/181,367, filed on May 27, 2009, provisional application No. 61/181,372, filed on May 27, 2009, provisional application No. 61/181,369, filed on May 27, 2009, provisional application No. 61/181,372, filed on May 27, 2009, provisional application No. 61/181,377, filed on May 27, 2009.

(51) Int. Cl.
*H01J 49/04* (2006.01)
*H01J 49/26* (2006.01)

(52) U.S. Cl.
USPC ........ 250/281; 250/282; 250/288; 250/396 R; 250/423 R; 250/424; 313/363.1; 315/111.31

(58) Field of Classification Search
USPC .......... 250/281, 282, 288, 396 R, 423 R, 424; 313/363.1; 315/111.31
See application file for complete search history.

(56) References Cited

U.S. PATENT DOCUMENTS

| | | |
|---|---|---|
| 5,625,185 A | 4/1997 | Laser |
| 5,793,039 A | 8/1998 | Oishi et al. |

(Continued)

FOREIGN PATENT DOCUMENTS

| | | |
|---|---|---|
| EP | 1109196 | 6/2001 |
| JP | 1125903 | 1/1999 |

(Continued)

OTHER PUBLICATIONS

Jordan et al., "*Refractory Graphite Skimmers for Supersonic Free-Jet, Supersonic Arc-Jet, and Plasma Discharge Applications*", Review of Scientific Instruments, vol. 70, No. 3, pp. 1640-1648, Mar. 1999.

(Continued)

*Primary Examiner* — Nikita Wells
(74) *Attorney, Agent, or Firm* — Diederiks & Whitelaw, PLC

(57) ABSTRACT

A sampling cone of a mass spectrometer is disclosed having a metallic boride coating such as titanium diboride.

40 Claims, 5 Drawing Sheets

(56) References Cited

U.S. PATENT DOCUMENTS

| | | | |
|---|---|---|---|
| 6,608,318 B1 | 8/2003 | Perkins et al. | |
| 6,703,610 B2 | 3/2004 | Mordehai | |
| 6,992,284 B2 * | 1/2006 | Schultz et al. | 250/287 |
| 7,009,176 B2 | 3/2006 | Thakur | |
| 7,022,981 B2 | 4/2006 | Kato | |
| 7,838,842 B2 | 11/2010 | Horsky | |
| 8,269,164 B2 | 9/2012 | Finlay et al. | |
| 8,471,198 B2 * | 6/2013 | Jones et al. | 250/281 |
| 2001/0037817 A1 | 11/2001 | Abbott | |
| 2008/0223409 A1 | 9/2008 | Horsky et al. | |
| 2012/0153141 A1 * | 6/2012 | Wouters et al. | 250/282 |
| 2013/0299691 A1 * | 11/2013 | Jones et al. | 250/282 |

FOREIGN PATENT DOCUMENTS

| | | |
|---|---|---|
| JP | 2002008584 | 1/2002 |
| JP | 2004039313 | 2/2004 |
| JP | 2004186113 | 7/2004 |
| KR | 20090015392 | 2/2009 |

OTHER PUBLICATIONS

Sugizaki et al., "*Improvement of Corrosion Resistance of Titanium by Co-Implantation*", Surface and Coating Technology, vol. 83, pp. 167-174, 1996.

Tractors, "*Industrial Diamond and Diamonlike Films*", Coatings Technology Handbook, pp. 33-1-33-6, 2006.

* cited by examiner

| Intensity | Factor | | |
|---|---|---|---|
| Compound | Aged stainless steel | aged TiC | clean stainless steel |
| Acetominophen | 1 | 1.29 | 1.30 |
| Caffeine | 1 | 1.52 | 1.49 |
| Sulphodimethoxine | 1 | 1.58 | 1.54 |
| Verapamil | 1 | 1.74 | 1.54 |
| 17a Hydroxyprogesterone | 1 | 1.92 | 1.98 |
| Chloramphenicol | 1 | 1.85 | 1.65 |

Fig. 2

| Area | Factor | | |
|---|---|---|---|
| Compound | Aged stainless steel | Aged TiC | clean stainless steel |
| Acetominophen | 1 | 1.31 | 1.32 |
| Caffeine | 1 | 1.53 | 1.49 |
| Sulphodimethoxine | 1 | 1.53 | 1.52 |
| Verapamil | 1 | 1.78 | 1.60 |
| 17a Hydroxyprogesterone | 1 | 1.97 | 1.93 |
| Chloramphenicol | 1 | 1.92 | 1.67 |

Fig. 4

| Area | Factor | | | | | |
|---|---|---|---|---|---|---|
| Compound | SS (Aged) | | SS (cleaned) | | TiC (Aged) | |
| | S:N | Noise | S:N | Noise | S:N | Noise |
| AM | 1 | 1 | 1.47 | 0.92 | 1.36 | 0.94 |
| Caffeine | 1 | 1 | 1.92 | 0.77 | 1.86 | 0.82 |
| SDM | 1 | 1 | 2.93 | 0.48 | 1.85 | 0.84 |
| Verapamil | 1 | 1 | 2.48 | 0.57 | 2.57 | 0.74 |
| 17a HP | 1 | 1 | 3.06 | 0.62 | 2.23 | 0.79 |
| CMP | 1 | 1 | 2.74 | 1.78 | 1.78 | 0.96 |

Fig. 5

MASS SPECTROMETER SAMPLING CONE WITH COATING

CROSS REFERENCE TO RELATED APPLICATIONS

This application is a continuation of U.S. Application Ser. No. 13/294,650 filed on 11 Nov. 2011, which is a continuation-in-part of PCT/GB2010/000967, filed 13 May 2010, which claims priority to U.S. Provisional Patent Application Ser. Nos. 61/181,367, filed on 27 May 2009, and 61/181,372 filed on 27 May 2009, and United Kingdom Patent Application Nos. 0908249.6, filed on 13 May 2009, and 0908252.0, filed on 13 May 2009, and is a continuation-in-part of PCT/GB2010/000965, filed 13 May 2010, which claims priority to U.S. Provisional Patent Application Ser. No. 61/181,369 filed on 27 May 2009, and United Kingdom Patent Application No. 0908250.4, filed on 13 May 2009, and is a continuation-in-part of PCT/GB2010/000956, filed 13 May 2010, which claims priority to and benefit of U.S. Provisional Patent Application Ser. No. 61/181,372, filed on 27 May 2009 and United Kingdom Patent Application No. 0908252.0, filed on 13 May 2009, and is a continuation-in-part of PCT/GB2010/000957, filed 13 May 2010, which claims priority to U.S. Provisional Patent Application Ser. No. 61/181,377, filed on 27 May 2009, and United Kingdom Patent Application No. 0908251.2, filed on 13 May 2009. The entire contents of these applications are incorporated herein by reference.

BACKGROUND

Mass spectrometers comprising a Liquid chromatography ion source are well known. Liquid chromatography is a method by which species from a mixture can be separated into their individual components. The basic components of a liquid chromatography system are a pumping system comprising at least two solvent channels and a tube filled with stationary phase and a column onto which components are initially trapped. By adjusting the percentage composition of the solvent channels, species are released from the stationary phase to be detected by various means at the column output.

The inside diameters of LC columns vary widely from, for example, <50 µm to >4.6 mm. The delivery flow rate required from the pumping system increases with the inside diameter of the column and ranges from several nanoliters per minute to several milliters per minute. To produce a gradient at a flow rate of several nL/min it is often necessary to split the delivery flow rate from a liquid chromatograph. The LC eluent may then pass to an Atmospheric Pressure Ionisation ("API") ion source where a range of ionisation processes may occur. The ion source may, for example, comprise an Electrospray Ionisation ("ESI") ion source, an Atmospheric Pressure Chemical Ionisation ("APCI") ion source or an Atmospheric Pressure Photoionisation ("APPI") ion source.

Electrospray Ionisation is a widely used technique in mass spectrometry in which species present in a flowing solution are ionised by the application of a high voltage. Electrospray is known as a soft ionisation technique because the resulting ions typically comprise relatively large molecular weight species (e.g. peptides) which can then be detected as intact ions by a mass analyser. Electrospray ionisation can be achieved at several different flow rates ranging from several nL/min to several mL/min. The ion counts observed in a mass spectrometer during Electrospray Ionisation are not, to a first approximation, flow rate dependent and as such large sensitivity gains for the same signal to noise ratios can be achieved at lower flow rates due to much lower sample consumption.

The coupling of liquid chromatography and Electrospray mass spectrometry (LCMS) and tandem mass spectrometry (LCMS/MS) is a powerful technique that is widely used in many laboratories.

Mass spectrometers commonly comprise a sampling cone together with a cone-gas cone which forms the interface between the mass spectrometer and an ion source such as an Electrospray Ionisation ion source. A cone gas or curtain gas may be provided to the annulus between the inner sampling cone and the outer cone-gas cone. Ions which pass through the sampling cone are then transmitted through a first vacuum chamber and are transmitted onwardly through an extraction cone into a second vacuum chamber. Conventionally, the sampling cone, cone-gas cone and extraction cone are made from stainless steel. Stainless steel is considered to be relatively inert and non-reactive. However, conventional sampling cones, cone-gas cones and extraction cones need regular cleaning in order to maintain high performance.

Conventional sampling cones, cone-gas cones and extraction cones can suffer from increased surface contamination following regular analysis of complex matrix extracts such as urine, saliva, plasma, whole blood, waters and soils. In addition complex buffered eluent systems such as ammonium acetate, ammonium formate, sodium phosphate, sodium borate and sodium formate can also cause contamination. Other potential additives which can increase surface activity and/or contamination include formic acid, trifluoroacetic acid and ammonia.

It is desired to provide an improved sampling cone, cone-gas cone and extraction cone for a mass spectrometer. In particular, it is desired to provide a more robust sampling cone, cone-gas cone and extraction cone which is less reactive than stainless steel and which requires less intensive cleaning than conventional sampling cones, cone-gas cones and extraction cones.

Also well known are Mass spectrometers comprising a gas chromatograph coupled to an Electron Ionisation ("EI") or Chemical Ionisation ("CI") ion source are well known. A gas chromatograph comprises a packed column or open capillary tube located in a heated chamber. Analyte gas molecules are caused to pass through the column. Gas molecules having different sizes and structures will take different amounts of time to elute from the gas chromatograph.

Ions which emerge from the gas chromatograph are then commonly ionised either by an Electron Ionisation ion source or by a Chemical Ionisation ion source.

An EI ion source comprises an ion chamber through which an electron beam is passed. Analyte gas molecules interact with the electron beam and are subsequently ionised. The ionisation process is commonly referred to as being a hard ionisation process in that the analyte molecules are caused to fragment as a result of the ionisation process. The resulting EI fragment ions are then mass analysed.

A CI ion source utilises a reagent gas (e.g. methane or ammonia) and may be operated in either a positive or negative mode of operation. Neutral reagent gas is arranged to be ionised by interactions with free electrons emitted from a filament. The resulting reagent ions are then caused to interact and ionise neutral analyte molecules resulting in the formation of analyte ions. The resulting analyte ions are then mass analysed.

The coupling of a gas chromatography column with an EI or CI ion source and a mass spectrometer is a powerful technique that is widely used in many laboratories.

Conventionally, EI and CI ion sources comprise ion source chambers made from stainless steel. Stainless steel is considered to be relatively inert and non-reactive. However, conventional EI and CI ion source chambers need regular cleaning in order to maintain high performance.

Conventional EI and CI ion source chambers can suffer from increased surface contamination following regular analysis of complex matrix extracts such as urine, saliva, plasma, whole blood, waters and soils.

SUMMARY

Venous embodiments entail coatings on skimmer cones, for example, a surface coating or layer on a sampling cone, cone-gas cone and/or extraction cone of a mass spectrometer. Some preferred coatings or layers include: 1) metallic carbide, such as TiC; 2) metallic boride; 3) ceramic or DLC, such as SiC; and 4) ion-implanted transition metals, such as ion-implanted titanium. For convenience, these four groups are summarized, in turn, next.

1) Metallic Carbide

According to an aspect of one embodiment, of interest, there is provided a mass spectrometer comprising a sampling cone and/or a cone-gas cone, wherein the sampling cone and/or the cone-gas cone comprise a first coating or surface provided on at least a portion of the sampling cone and/or the cone-gas cone, wherein the first coating or surface comprises a metallic carbide coating or surface.

The sampling cone and/or the cone-gas cone is preferably made from a material selected from the group consisting of: (i) stainless steel; (ii) a steel alloy comprising 11.5% chromium wt. %; (iii) an austenitic stainless steel; (iv) a ferritic stainless steel; (v) an austenitic-ferritic or duplex steel; (vi) titanium; (vii) a titanium alloy; (viii) a nickel-base alloy; (ix) a nickel-chromium alloy; (x) a nickel-chromium alloy comprising ≥50.0% nickel wt. %; and (xi) INCONEL™ 600, 625, 690, 702, 718, 939 or X750.

The sampling cone and/or the cone-gas cone preferably comprises stainless steel or an alloy comprising: (i) 0-0.01 wt. % carbon; (ii) 0.01-0.02 wt. % carbon; (iii) 0.02-0.03 wt. % carbon; (iv) 0.03-0.04 wt. % carbon; (v) 0.04-0.05 wt. % carbon; (vi) 0.05-0.06 wt. % carbon; (vii) 0.06-0.07 wt. % carbon; (viii) 0.07-0.08 wt % carbon; and (ix) >0.08 wt. % carbon.

The sampling cone and/or the cone-gas cone preferably comprises stainless steel or an alloy comprising: (i) 0-0.01 wt. % nitrogen; (ii) 0.01-0.02 wt. % nitrogen; (iii) 0.02-0.03 wt. % nitrogen; (iv) 0.03-0.04 wt. % nitrogen; (v) 0.04-0.05 wt. % nitrogen; (vi) 0.05-0.06 wt. % nitrogen; (vii) 0.06-0.07 wt. % nitrogen; and (viii) >0.07 wt. % nitrogen.

The sampling cone and/or the cone-gas cone preferably comprises stainless steel or an alloy comprising: (i) 0-0.1 wt. % nitrogen; (ii) 0.1-0.2 wt. % nitrogen; (iii) 0.2-0.3 wt. % nitrogen; (iv) 0.3-0.4 wt. % nitrogen; (v) 0.4-0.5 wt. % nitrogen; (vi) 0.5-0.6 wt. % nitrogen; (vii) 0.6-0.7 wt % nitrogen; and (viii) >0.7 wt. % nitrogen.

The sampling cone and/or the cone-gas cone preferably comprises stainless steel or an alloy comprising: (i) 12.0-13.0 wt. % chromium; (ii) 13.0-14.0 wt. % chromium; (iii) 14.0-15.0 wt. % chromium; (iv) 15.0-16.0 wt. % chromium; (v) 16.0-17.0 wt. % chromium; (vi) 17.0-18.0 wt. % chromium; (vii) 18.0-19.0 wt. % chromium; (viii) 19.0-20.0 wt. % chromium; (ix) 20.0-21.0 wt. % chromium; (x) 21.0-22.0 wt. % chromium; (xi) 22.0-23.0 wt. % chromium; (xii) 23.0-24.0 wt. % chromium; (xiii) 24.0-25.0 wt. % chromium; (xiv) 25.0-26.0 wt. % chromium; (xv) 26.0-27.0 wt. % chromium; (xvi) 27.0-28.0 wt. % chromium; (xvii) 26.0-29.0 wt. % chromium; (xviii) 29.0-30.0 wt % chromium; and (xix) >30.0 wt. % chromium.

The sampling cone and/or the cone-gas cone preferably comprises stainless steel or an alloy comprising: (i) 0-1.0 wt. % nickel; (ii) 1.0-2.0 wt. % nickel; (iii) 2.0-3.0 wt. % nickel; (iv) 3.0-4.0 wt. % nickel; (v) 4.0-5.0 wt. % nickel; (vi) 5.0-6.0 wt. % nickel; (vii) 6.0-7.0 wt. % nickel; (viii) 7.0-8.0 wt. % nickel; (ix) 8.0-9.0 wt. % nickel; (x) 9.0-10.0 wt. % nickel; (xi) 10.0-11.0 wt. % nickel; (xii) 11.0-12.0 wt. % nickel; (viii) 12.0-13.0 wt. % nickel; (xiv) 13.0-14.0 wt. % nickel; (xv) 14.0-15.0 wt. % nickel; (xvi) 15.0-16.0 wt. % nickel; (xvii) 16.0-17.0 wt. % nickel; (xviii) 17.0-18.0 wt % nickel; (xix) 18.0-19.0 wt. % nickel; (xx) 19.0-20.0 wt. % nickel; (xxi) 20.0-21.0 wt. % nickel; (xxii) 21.0-22.0 wt. % nickel; (xxiii) 22.0-23.0 wt. % nickel; (xxiv) 23.0-24.0 wt. % nickel; (xxv) 24.0-25.0 wt. % nickel; (xxvi) 25.0-26.0 wt. % nickel; (xxvii) 26.0-27.0 wt. % nickel; (xxviii) 27.0-28.0 wt. % nickel; (xxix) 28.0-29.0 wt. % nickel; (xxx) 29.0-30.0 wt. % nickel; (xxxi) 30.0-31.0 wt. % nickel; (xxxii) 31.0-32.0 wt. % nickel; (xxxiii) 32.0-33.0 wt. % nickel; (xxxiv) 33.0-34.0 wt. % nickel; (xxxv) 34.0-35.0 wt. % nickel; (xxxvi) 35.0-36.0 wt. % nickel; (xxxvii) 36.0-37.0 wt. % nickel; (xxxviii) 37.0-38.0 wt. % nickel; (xxxix) 38.0-39.0 wt. % nickel; (xi) 39.0-40.0 wt. % nickel; (xli) 40.0-41.0 wt. % nickel; (xlii) 41.0-42.0 wt. % nickel; (xliii) 42.0-43.0 wt. % nickel; (xliv) 43.0-44.0 wt. % nickel; (xlv) 44.0-45.0 wt. % nickel; (xlvi) 45.0-46.0 wt. % nickel; (xlvii) >46.0 wt. % nickel.

The sampling cone and/or the cone-gas cone preferably comprises stainless steel or an alloy comprising: (i) 0-1.0 wt. % molybdenum; (ii) 1.0-2.0 wt. % molybdenum; (iii) 2.0-3.0 wt. % molybdenum; (iv) 3.0-4.0 wt. % molybdenum; (v) 4.0-5.0 wt. % molybdenum; (vi) 5.0-6.0 wt % molybdenum; (vii) 6.0-7.0 wt. % molybdenum; (viii) 7.0-8.0 wt. % molybdenum; and (ix) >8.0 wt. % molybdenum.

The sampling cone and/or the cone-gas cone preferably comprises stainless steel or an alloy comprising: (i) 0-1.0 wt. % copper; (ii) 1.0-2.0 wt % copper; (iii) 2.0-3.0 wt. % copper; (iv) 3.0-4.0 wt. % copper; and (v) >4.0 wt. % copper.

The sampling cone and/or the cone-gas cone preferably comprises stainless steel or an alloy comprising: (i) 0.01-1.0 wt. % X; (ii) 1.0-2.0 wt. % X; (iii) 2.0-3.0 wt. % X; (iv) 3.0-4.0 wt. % X; and (v) >4.0 wt. % X; wherein X comprises cobalt and/or tantalum and/or aluminium and/or titanium and/or niobium and/or silicon and/or manganese and/or tungsten and/or phosphorous.

The sampling cone and/or the cone-gas cone preferably forms an interface between an atmospheric pressure ion source and a first vacuum chamber of the mass spectrometer.

The sampling cone preferably comprises a first or inner conical or frusto-conical body defining a first orifice or circular aperture through which ions pass in use.

The first coating or surface is preferably provided on: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the first or inner conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the first or inner conical or frusto-conical body.

The cone-gas cone preferably comprises a second or outer conical or frusto-conical body defining a second orifice or annular aperture through which a cone gas emerges, in use, and wherein the second orifice or annular aperture substantially circumscribes at least part or substantially the whole of the first orifice or circular aperture.

The first coating or surface is preferably provided on: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the second or outer conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the second or outer conical or frusto-conical body.

The extraction cone preferably comprises a first coating or surface provided on at least a portion of the extraction cone, wherein the first coating or surface comprises a metallic carbide coating or surface.

The extraction cone is preferably made from a material selected from the group consisting of: (i) stainless steel; (ii) a steel alloy comprising ≥11.5% chromium wt. %; (iii) an austenitic stainless steel; (iv) a ferritic stainless steel; (v) an austenitic-ferritic or duplex steel; (vi) titanium; (vii) a titanium alloy; (viii) a nickel-base alloy; (ix) a nickel-chromium alloy; (x) a nickel-chromium alloy comprising 50.0% nickel wt. %; and (xi) INCONEL™ 600, 625, 690, 702, 718, 939 or X750.

The extraction cone preferably comprises stainless steel or an alloy comprising: (i) 0-0.01 wt. % carbon; (ii) 0.01-0.02 wt. % carbon; (iii) 0.02-0.03 wt. % carbon; (iv) 0.03-0.04 wt. % carbon; (v) 0.04-0.05 wt. % carbon; (vi) 0.05-0.06 wt. % carbon; (vii) 0.06-0.07 wt. % carbon; (viii) 0.07-0.08 wt. % carbon; and (ix) >0.08 wt. % carbon.

The extraction cone preferably comprises stainless steel or an alloy comprising: (i) 0-0.01 wt. % nitrogen; (ii) 0.01-0.02 wt % nitrogen; (iii) 0.02-0.03 wt. % nitrogen; (iv) 0.03-0.04 wt. % nitrogen; (v) 0.04-0.05 wt. % nitrogen; (vi) 0.05-0.06 wt. % nitrogen; (vii) 0.06-0.07 wt. % nitrogen; and (viii) >0.07 wt. % nitrogen.

The extraction cone preferably comprises stainless steel or an alloy comprising: (i) 0-0.1 wt. % nitrogen; (ii) 0.1-0.2 wt. % nitrogen; (iii) 0.2-0.3 wt. % nitrogen; (iv) 0.3-0.4 wt. % nitrogen; (v) 0.4-0.5 wt. % nitrogen; (vi) 0.5-0.6 wt. % nitrogen; (vii) 0.6-0.7 wt. % nitrogen; and (viii) >0.7 wt % nitrogen.

The extraction cone preferably comprises stainless steel or an alloy comprising: (i) 12.0-13.0 wt. % chromium; (ii) 13.0-14.0 wt. % chromium; (iii) 14.0-15.0 wt. % chromium; (iv) 15.0-16.0 wt. % chromium; (v) 16.0-17.0 wt. % chromium; (vi) 17.0-18.0 wt. % chromium; (vii) 18.0-19.0 wt. % chromium; (viii) 19.0-20.0 wt. % chromium; (ix) 20.0-21.0 wt. % chromium; (x) 21.0-22.0 wt % chromium; (xi) 22.0-23.0 wt. % chromium; (xii) 23.0-24.0 wt. % chromium; (xiii) 24.0-25.0 wt. % chromium; (xiv) 25.0-26.0 wt. % chromium; (xv) 26.0-27.0 wt. % chromium; (xvi) 27.0-28.0 wt. % chromium; (xvii) 28.0-29.0 wt. % chromium; (xviii) 29.0-30.0 wt. % chromium; and (xix) >30.0 wt. % chromium.

The extraction cone preferably comprises stainless steel or an alloy comprising: (i) 0-1.0 wt. % nickel; (ii) 1.0-2.0 wt. % nickel; (iii) 2.0-3.0 wt. % nickel; (iv) 3.0-4.0 wt. % nickel; (v) 4.0-5.0 wt. % nickel; (vi) 5.0-6.0 wt. % nickel; (vii) 6.0-7.0 wt. % nickel; (viii) 7.0-8.0 wt. % nickel; (ix) 8.0-9.0 wt. % nickel; (x) 9.0-10.0 wt. % nickel; (xi) 10.0-11.0 wt. % nickel; (xii) 11.0-12.9 wt. % nickel; (xiii) 12.0-13.0 wt. % nickel; (xiv) 13.0-14.0 wt. % nickel; (xv) 14.0-15.0 wt % nickel; (xvi) 15.0-16.0 wt. % nickel; (xvii) 16.0-17.0 wt. % nickel; (xviii) 17.0-18.0 wt. % nickel; (xix) 18.0-19.0 wt. % nickel; (xx) 19.0-20.0 wt. % nickel; (xxi) 20.0-21.0 wt. % nickel; (xxii) 21.0-22.0 wt. % nickel; (xxiii) 22.0-23.0 wt. % nickel; (xxiv) 23.0-24.0 wt. % nickel; (xxv) 24.0-25.0 wt. % nickel; (xxvi) 25.0-26.0 wt. % nickel; (xxvii) 26.0-27.0 wt. % nickel; (xxviii) 27.0-28.0 wt. % nickel; (xxix) 28.0-29.0 wt. % nickel; (xxx) 29.0-30.0 wt. % nickel; (xxxi) 30.0-31.0 wt. % nickel; (xxxii) 31.0-32.0 wt. % nickel; (xxxiii) 32.0-33.0 wt % nickel; (xxxiv) 33.0-34.0 wt. % nickel; (xxxv) 34.0-35.0 wt. % nickel; (xxxvi) 35.0-36.0 wt. % nickel; (xxxvii) 36.0-37.0 wt. % nickel; (xxxviii) 37.0-38.0 wt. % nickel; (xxxix) 38.0-39.0 wt. % nickel; (xl) 39.0-40.0 wt. % nickel; (xli) 40.0-41.0 wt. % nickel; (xlii) 41.0-42.0 wt. % nickel; (xliii) 42.0-43.0 wt. % nickel; (xliv) 43.0-44.0 wt. % nickel; (xlv) 44.0-45.0 wt. % nickel; (xlvi) 45.0-46.0 wt. % nickel; (xlvii) >46.0 wt. % nickel.

The extraction cone preferably comprises stainless steel or an alloy comprising: (i) 0-1.0 wt % molybdenum; (ii) 1.0-2.0 wt. % molybdenum; (iii) 2.0-3.0 wt. % molybdenum; (iv) 3.0-4.0 wt. % molybdenum; (v) 4.0-5.0 wt. % molybdenum; (vi) 5.0-6.0 wt. % molybdenum; (vii) 6.0-7.0 wt. % molybdenum; (viii) 7.0-8.0 wt. % molybdenum; and (ix) >8.0 wt. % molybdenum.

The extraction cone preferably comprises stainless steel or an alloy comprising: (i) 0-1.0 wt. % copper; (ii) 1.0-2.0 wt. % copper; (iii) 2.0-3.0 wt. % copper; (iv) 3.0-4.0 wt. % copper; and (v) >4.0 wt. % copper.

The extraction cone preferably comprises stainless steel or an alloy comprising: (i) 0.01-1.0 wt. % X; (ii) 1.0-2.0 wt. % X; (iii) 2.0-3.0 wt. % X; (iv) 3.0-4.0 wt. % X; and (v) >4.0 wt. % X; wherein X comprises cobalt and/or tantalum and/or aluminium and/or titanium and/or niobium and/or silicon and/or manganese and/or tungsten and/or phosphorous.

The extraction cone preferably forms an interface between a first or further vacuum chamber of the mass spectrometer and a second or further vacuum chamber of the mass spectrometer.

The extraction cone preferably comprises a first or inner conical or frusto-conical body defining a first orifice or circular aperture through which ions pass in use.

The first coating or surface is preferably provided on: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the first or inner conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the first or inner conical or frusto-conical body.

The extraction cone preferably further comprises a second or outer conical or frusto-conical body defining a second orifice or annular aperture, wherein the second orifice Of annular aperture substantially circumscribes at least part or substantially the whole of the first orifice or circular aperture.

The first coating or surface is preferably provided on: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the second or outer conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the second or outer conical or frusto-conical body.

The first coating or surface is preferably selected from the group consisting of: (i) aluminium carbide or $Al_4C_3$; (ii) chromium carbide, $CrC$, $Cr_{23}C_6$, $Cr_3C$, $Cr_7C_3$, or $Cr_3C_2$; (iii) copper carbide; (iv) hafnium carbide, $HfC$ or $HfC_{0.99}$; (v) iron carbide, $Fe_3C$, $Fe_7C_3$ or $Fe_2C$; (vi) iridium carbide; (vii) manganese carbide, $MnC$ or $Mn_{23}C_6$; (viii) molybdenum carbide, $Mo_2C$ or $Mo_3C_2$; (ix) nickel carbide or $MC$; (x) niobium carbide, $NbC$, $Nb_2C$, $NbC_{0.99}$, or $Nb_4C_3$; (xi) osmium carbide; (xii) palladium carbide; (xiii) platinum carbide; (xiv) rhenium carbide; (xv) rhodium carbide or $RhC$; (xvi) ruthenium carbide; (xvii) scandium carbide or $ScC$; (xviii) tantalum carbide, $TaC$, $Ta_2C$, $TaC_{0.99}$ or $Ta_4C_3$; (xix) titanium carbide or $TiC$; (xx) tungsten carbide, $WC$ or $VV_2C$; (xxi) vanadium carbide, $VC$, $VC_{0.97}$, $V_4C_3$; (xxii) yttrium carbide or $YC_2$; (xxiii) zirconium carbide, $ZrC$ or $ZrC_{0.97}$; and (xxiv) silicon carbide or $SiC$.

The first coating or surface preferably comprises: (i) a transition metal carbide; (ii) a carbide alloy; or (iii) a mixed metal carbide alloy.

The first coating or surface preferably has either:

(a) a resistivity selected from the group consisting of: (i) <$10^{-3}$ Ω-m; (ii) <$10^{-4}$ Ω-m; (iii) <$10^{-5}$ Ω-m; (iv) <$10^{-6}$ Ω-m; (v) <$10^{-7}$ Ω-m; (vi) $10^{-3}$-$10^{-4}$ Ω-m; (vii) $10^{-4}$-$10^{-6}$ Ω-m; (viii) $10^{-5}$-$10^{-6}$ Ω-m; and (ix) $10^{-6}$-$10^{-7}$ Ω-m; and/or (b) a Vickers hardness number or Vickers Pyramid Number (HV) selected from the group consisting of: (i) >1000; (ii) 1000-1100; (iii) 1100-1200; (iv) 1200-1300; (v) 1300-1400; (vi) 1400-1500; (vii) 1500-1600; (viii) 1600-1700; (ix) 1700-1800; (x) 1800-1900; (xi) 1900-2000; (xii) 2000-2100; (xiii) 2100-2200; (xiv) 2200-2300; (xv) 2300-2400; (xvi) 2400-2500; (xvii) 2500-2600; (xviii) 2600-2700; (xix) 2700-2800; (xx) 2800-2900; (xxi) 2900-3000; (xxii) 3000-3100; (xxiii) 3100-3200; (xxiv) 3200-3300; (xv) 3300-3400; (xvi) 3400-3500; and (xvii) >3500, wherein the Vickers hardness number or Vickers Pyramid Number is determined at a load of 30, 40, 50, 60 or 70 kg; and/or (c) a Vickers microhardness selected from the group consisting of: (i) >1000 kg/mm; (ii) 1000-1100 kg/mm; (iii) 1100-1200 kg/mm; (iv) 1200-1300 kg/mm; (v) 1300-1400 kg/mm; (vi) 1400-1500 kg/mm; (vii) 1500-1600 kg/mm; (viii) 1600-1700 kg/mm, (ix) 1700-1800 kg/mm; (x) 1800-1900 kg/mm; (xi) 1900-2000 kg/mm; (xii) 2000-2100 kg/mm; (xiii) 2100-2200 kg/mm; (xiv) 2200-2300 kg/mm; (xv) 2300-2400 kg/mm; (xvi) 2400-2500 kg/mm; (xvii) 2500-2600 kg/mm; (xviii) 2600-2700 kg/mm; (xix) 2700-2800 kg/mm; (xx) 2800-2900 kg/mm; (xxi) 2900-3000 kg/mm; (xxii) 3000-3100 kg/mm; (xxiii) 3100-3200 kg/mm; (xxiv) 3200-3300 kg/mm; (xv) 3300-3400 kg/mm; (xvi) 3400-3500 kg/mm; and (xvii) >3500 kg/mm, and/or (d) a thickness selected from the group consisting of: (i) <1 μm; (ii) 1-2 μm; (iii) 2-3 μm; (iv) 3-4 μm; (v) 4-5 μm; (vi) 5-6 μm; (vii) 6-7 μm; (viii) 7-8 μm; (ix) 8-9 μm; (x) 9-10 μm; (xi) >10 μm; and/or (e) a density selected from the group consisting of: (i) <3.0 g cm$^{-3}$; (ii) 3.0-3.5 g cm$^{-3}$; (iii) 3.5-4.0 g cm$^{-3}$; (iv) 4.0-4.5 g cm$^{-3}$; (v) 4.5-5.0 g cm$^{-3}$; (vi) 5.0-5.5 g cm$^{-3}$; (vii) 5.5-6.0 g cm$^{-3}$; (viii) 6.0-6.5 g cm$^{-3}$; (ix) 6.5-7.0 g cm$^{-3}$; (x) 7.0-7.5 g cm$^{-3}$; (xi) 7.5-8.0 g cm$^{-3}$; (xii) 8.0-8.5 g cm$^{-3}$; (xiii) 8.5-9.0 g cm$^{-3}$; (xiv) 9.0-9.5 g cm$^{-3}$; (xv) 9.5-10.0 g cm$^{-3}$; (xvi) 10.0-10.5 g cm$^{-3}$; (xvii) 10.5-11.0 g cm$^{-3}$; (xviii) 11.0-11.5 g cm$^{-3}$; (xix) 11.5-12.0 g cm$^{-3}$; (xx) 12.0-12.5 g cm$^{-3}$; (xxi) 12.5-13.0 g cm$^{-3}$; (xxii) 13.0-13.5 g cm$^{-3}$; (xxii) 13.5-14.0 g cm$^{-3}$; (xxiv) 14.0-14.5 g cm$^{-3}$; (xxv) 14.5-15.0 g cm$^{-3}$; (xxvi) 15.0-15.5 g cm$^{-3}$; (xxvii) 15.5-16.0 g cm$^{-3}$; (xxviii) 16.0-16.5 g cm$^{-3}$; (xxix) 16.5-17.0 cm$^{-3}$; (xxx) 17.0-17.5 g cm$^{-3}$; (xxxi) 17.5-18.0 g cm$^{-3}$; (xxxii) 18.0-18.5 g cm$^{-3}$; (xxxiii) 18.5-19.0 g cm$^{-3}$; (xxxiv) 19.0-19.5 g cm$^{-3}$; (xxxv) 19.5-20.0 g cm$^{-3}$; and (xxxvi) >20.0 g cm$^{-3}$; and/or (f) a coefficient of friction selected from the group consisting of: (i) <0.01; (ii) 0.01-0.02; (iii) 0.02-0.03; (iv) 0.03-0.04; (v) 0.04-0.05; (vi) 0.05-0.06; (vii) 0.06-0.07; (viii) 0.07-0.08; (ix) 0.08-0.09; (x) 0.09-0.10; and (xi) >0.1.

According to another aspect of the present invention there is provided a method of mass spectrometry comprising:

passing ions through a sampling cone and/or a cone-gas cone of a mass spectrometer, wherein the sampling cone and/or the cone-gas cone comprises a first coating or surface provided on at least a portion of the sampling cone and/or the cone-gas cone, wherein the first coating or surface comprises a metallic carbide coating or surface.

According to another aspect of the present invention there is provided a method of mass spectrometry comprising:

passing ions through an extraction cone of a mass spectrometer, wherein the extraction cone comprises a first coating or surface provided on at least a portion of the extraction cone, wherein the first coating or surface comprises a metallic carbide coating or surface.

According to another aspect of the present invention there is provided a method of making a sampling cone and/or a cone-gas cone for a mass spectrometer comprising:

depositing, sputtering or forming a first coating or surface on at least a portion of a sampling cone and/or a cone-gas cone of a mass spectrometer, wherein the first coating or surface comprises a metallic carbide coating or surface.

According to another aspect of the present invention there is provided a method of making an extraction cone for a mass spectrometer comprising:

depositing, sputtering or forming a first coating or surface on at least a portion of an extraction cone of a mass spectrometer, wherein the first coating or surface comprises a metallic carbide coating or surface.

2) Metallic Boride

According to another aspect, there is provided a mass spectrometer comprising a sampling cone and/or a cone-gas cone, wherein the sampling cone and/or cone-gas cone comprises a first coating or surface on at least a portion of the sampling cone and/or cone-gas cone, wherein the first coating or surface comprises a metallic boride coating or surface.

The sampling cone and/or the cone-gas cone is preferably made from a material selected from the group consisting of: (i) stainless steel; (ii) a steel alloy comprising ≥11.5% chromium wt. %; (iii) an austenitic stainless steel; (iv) a ferritic stainless steel; (v) an austenitic-ferritic or duplex steel; (vi) titanium; (vii) a titanium alloy; (viii) a nickel-base alloy; (ix) a nickel-chromium alloy; (x) a nickel-chromium alloy comprising ≥50.0% nickel wt. %; and (xi) INCONEL™ 600, 625, 690, 702, 718, 939 or X750.

The sampling cone and/or the cone-gas cone preferably comprises stainless steel or an alloy comprising: (i) 0-0.01 wt. % carbon; (ii) 0.01-0.02 wt. % carbon; (iii) 0.02-0.03 wt. % carbon; (iv) 0.03-0.04 wt. % carbon; (v) 0.04-0.05 wt. % carbon; (vi) 0.05-0.06 wt. % carbon; (vii) 0.06-0.07 wt. % carbon; (viii) 0.07-0.08 wt. % carbon; and (ix) >0.08 wt. % carbon.

The sampling cone and/or the cone-gas cone preferably comprises stainless steel or an alloy comprising: (i) 0-0.01 wt. % nitrogen; (ii) 0.01-0.02 wt. % nitrogen; (iii) 0.02-0.03 wt. % nitrogen; (iv) 0.03-0.04 wt. % nitrogen; (v) 0.04-0.05 wt. % nitrogen; (vi) 0.05-0.06 wt. % nitrogen; (vii) 0.06-0.07 wt. % nitrogen; and (viii) >0.07 wt. % nitrogen.

The sampling cone and/or the cone-gas cone preferably comprises stainless steel or an alloy comprising: (i) 0-0.1 wt. % nitrogen: (ii) 0.1-0.2 wt. % nitrogen; (iii) 0.2-0.3 wt. % nitrogen; (iv) 0.3-0.4 wt. % nitrogen; (v) 0.4-0.5 wt. % nitrogen; (vi) 0.5-0.6 wt. % nitrogen; (vii) 0.6-0.7 wt. % nitrogen; and (viii) >0.7 wt. % nitrogen.

The sampling cone and/or the cone-gas cone preferably comprises stainless steel or an alloy comprising: (i) 12.0-13.0 wt. % chromium; (ii) 13.0-14.0 wt. % chromium; (iii) 14.0-15.0 wt. % chromium; (iv) 15.0-16.0 wt. % chromium; (v) 16.0-17.0 wt. % chromium; (vi) 17.0-18.0 wt. % chromium; (vii) 18.0-19.0 wt. % chromium; (viii) 19.0-20.0 wt. % chromium; (ix) 20.0-21.0 wt. % chromium; (x) 21.0-22.0 wt. % chromium; (xi) 22.0-23.0 wt. % chromium; (xii) 23.0-24.0 wt. % chromium; (xlii) 24.0-25.0 wt. % chromium; (xiv) 25.0-26.0 wt. % chromium; (xv) 26.0-27.0 wt. % chromium; (xvi) 27.0-28.0 wt. % chromium; (xvii) 28.0-29.0 wt. % chromium; (xviii) 29.0-30.0 wt. % chromium; and (xix) >30.0 wt. % chromium.

The sampling cone and/or the cone-gas cone preferably comprises stainless steel or an alloy comprising: (i) 0-1.0 wt. % nickel; (ii) 1.0-2.0 wt. % nickel; (iii) 2.0-3.0 wt. % nickel; (iv) 3.0-4.0 wt. % nickel; (v) 4.0-5.0 wt. % nickel; (vi) 5.0-6.0 wt % nickel; (vii) 6.0-7.0 wt. % nickel; (viii) 7.0-8.0 wt. % nickel; (ix) 8.0-9.0 wt. % nickel; (x) 9.0-10.0 wt. % nickel; (xi) 10.0-11.0 wt. % nickel; (xii) 11.0-12.0 wt. % nickel; (xiii) 12.0-13.0 wt. % nickel; (xiv) 13.0-14.0 wt. % nickel; (xv) 14.0-15.0 wt. % nickel; (xvi) 15.0-16.0 wt. % nickel; (xvii) 16.0-17.0 wt. % nickel; (xviii) 17.0-18.0 wt. % nickel; (xix) 18.0-19.0 wt. % nickel; (xx) 19.0-20.0 wt. % nickel; (xxi) 20.0-21.0 wt. % nickel; (xxii) 21.0-22.0 wt. % nickel; (xxiii) 22.0-23.0 wt % nickel; (xxiv) 23.0-24.0 wt. % nickel; (xxv) 24.0-25.0 wt. % nickel; (xxvi) 25.0-26.0 wt. % nickel; (xxvii) 26.0-27.0 wt. % nickel; (swill) 27.0-28.0 wt. % nickel; (xxix) 28.0-29.0 wt. % nickel; (xxx) 29.0-30.0 wt. % nickel; (xxxi) 30.0-31.0 wt. % nickel; (xxxii) 31.0-32.0 wt. % nickel; (xxxiii) 32.0-33.0 wt. % nickel; (xxxiv) 33.0-34.0 wt. % nickel; (xxxv) 34.0-35.0 wt. % nickel; (xxxvi) 35.0-36.0 wt. % nickel; (xxxvii) 36.0-37.0 wt. % nickel; (xxxviii) 37.0-38.0 wt. % nickel; (xxxix) 38.0-39.0 wt. % nickel; (xl) 39.0-40.0 wt. % nickel; (xli) 40.0-41.0 wt. % nickel; (xlii) 41.0-42.0 wt. % nickel; (xliii) 42.0-43.0 wt. % nickel; (xliv) 43.0-44.0 wt. % nickel; (xlv) 44.0-45.0 wt. % nickel; (xlvi) 45.0-46.0 wt. % nickel; (xlvii) >46.0 wt. % nickel.

The sampling cone and/or the cone-gas cone preferably comprises stainless steel or an alloy comprising: (i) 0-1.0 wt. % molybdenum; (ii) 1.0-2.0 wt. % molybdenum; (iii) 2.0-3.0 wt. % molybdenum; (iv) 3.0-4.0 wt. % molybdenum; (v) 4.0-5.0 wt. % molybdenum; (vi) 5.0-6.0 wt. % molybdenum; (vii) 6.0-7.0 wt. % molybdenum; (viii) 7.0-8.0 wt. % molybdenum; and (ix) >8.0 wt. % molybdenum.

The sampling cone and/or the cone-gas cone preferably comprises stainless steel or an alloy comprising: (i) 0-1.0 wt. % copper; (ii) 1.0-2.0 wt. % copper; (iii) 2.0-3.0 wt. % copper; (iv) 3.0-4.0 wt. % copper; and (v) >4.0 wt. % copper.

The sampling cone and/or the cone-gas cone preferably comprises stainless steel or an alloy comprising: (i) 0.01-1.0 wt. % X; (ii) 1.0-2.0 wt. % X; (iii) 2.0-3.0 wt. % X; (iv) 3.0-4.0 wt. % X; and (v) >4.0 wt. % X; wherein X comprises cobalt and/or tantalum and/or aluminium and/or titanium and/or niobium and/or silicon and/or manganese and/or tungsten and/or phosphorous.

The sampling cone and/or the cone-gas cone preferably forms an interface between an atmospheric pressure ion source and a first vacuum chamber of the mass spectrometer.

The sampling cone preferably comprises a first or inner conical or frusto-conical body defining a first orifice or circular aperture through which ions pass in use.

The first coating or surface is preferably provided on: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the first or inner conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the first or inner conical or frusto-conical body.

The cone-gas cone preferably comprises a second or outer conical or frusto-conical body defining a second orifice or annular aperture through which a cone gas emerges, in use, and wherein the second orifice or annular aperture substantially circumscribes at least part or substantially the whole of the first orifice or circular aperture.

The first coating or surface is preferably provided on: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the second or outer conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the second or outer conical or frusto-conical body.

According to another aspect of the present invention there is provided a mass spectrometer comprising an extraction cone, whereas the extract cone comprises a first coating or surface provided on at least a portion of the extraction cone, wherein the first coating or surface comprises a metallic boride coating or surface.

The extraction cone is preferably made from a material selected from the group consisting of: (i) stainless steel; (ii) a steel alloy comprising ≥11.5% chromium wt. %; (iii) an austenitic stainless steel; (iv) a ferritic stainless steel; (v) an austenitic-ferritic or duplex steel; (vi) titanium; (vii) a titanium alloy; (viii) a nickel-base alloy; (ix) a nickel-chromium alloy; (x) a nickel-chromium alloy comprising ≥50.0% nickel wt. %; and (xi) INCONEL™ 600, 625, 690, 702, 718, 939 or X750.

The extraction cone preferably comprises stainless steel or an alloy comprising: (i) 0-0.01 wt. % carbon; (ii) 0.01-0.02 wt. % carbon; (iii) 0.02-0.03 wt. % carbon; (iv) 0.03-0.04 wt. % carbon; (v) 0.04-0.05 wt. % carbon; (vi) 0.05-0.06 wt. % carbon; (vii) 0.06-0.07 wt. % carbon; (viii) 0.07-0.08 wt. % carbon; and (ix) >0.08 wt. % carbon.

The extraction cone preferably comprises stainless steel or an alloy comprising: (i) 0-0.01 wt. % nitrogen; (ii) 0.01-0.02 wt. % nitrogen; (iii) 0.02-0.03 wt. % nitrogen; (iv) 0.03-0.04 wt. % nitrogen; (v) 0.04-0.05 wt. % nitrogen; (vi) 0.05-0.06 wt. % nitrogen; (vii) 0.06-0.07 wt. % nitrogen; and (viii) >0.07 wt. % nitrogen.

The extraction cone preferably comprises stainless steel or an alloy comprising: (i) 0-0.1 wt. % nitrogen; (ii) 0.1-0.2 wt. % nitrogen; (iii) 0.2-0.3 wt. % nitrogen; (iv) 0.3-0.4 wt. % nitrogen; (v) 0.4-0.5 wt. % nitrogen; (vi) 0.5-016 wt. % nitrogen; (vii) 0.6-0.7 wt. % nitrogen; and (viii) >0.7 wt. % nitrogen.

The extraction cone preferably comprises stainless steel or an alloy comprising: (i) 12.0-13.0 wt. % chromium; (ii) 13.0-14.0 wt. % chromium; (iii) 14.0-15.0 wt. % chromium; (iv) 15.0-160 wt. % chromium; (v) 16.0-17.0 wt. % chromium; (vi) 17.0-18.0 wt. % chromium; (vii) 18.0-19.0 wt. % chromium; (viii) 19.0-20.0 wt. % chromium; (ix) 20.0-21.0 wt. % chromium; (x) 21.0-22.0 wt. % chromium; (xi) 22.0-23.0 wt. % chromium; (xi) 23.0-24.0 wt % chromium; (xiii) 24.0-25.0 wt. % chromium; (xiv) 25.0-26.0 wt. % chromium; (xv) 26.0-27.0 wt. % chromium; (xvi) 27.0-28.0 wt. % chromium; (vii) 28.0-29.0 wt. % chromium; (xviii) 29.0-30.0 wt. % chromium; and (xix) >30.0 wt. % chromium.

The extraction cone preferably comprises stainless steel or an alloy comprising: (i) 0-1.0 wt. % nickel; (ii) 1.0-2.0 wt. % nickel; (iii) 2.0-3.0 wt. % nickel; (iv) 3.0-4.0 wt. % nickel; (v) 4.0-5.0 wt. % nickel; (vi) 5.0-6.0 wt. % nickel; (vii) 6.0-7.0 wt. % nickel; (viii) 7.0-8.0 wt. % nickel: (ix) 8.0-9.0 wt. % nickel; (x) 9.0-10.0 wt. % nickel; (xi) 10.0-11.0 wt. % nickel; (xii) 11.0-12.0 wt. % nickel; (xiii) 12.0-13.0 wt. % nickel; (xiv) 13.0-14.0 wt. % nickel; (xv) 14.0-15.0 wt. % nickel; (xvi) 15.0-16.0 wt. % nickel; (xvii) 16.0-17.0 wt. % nickel; (xviii) 17.0-18.0 wt. % nickel; (xix) 18.0-19.0 wt. % nickel; (xx) 19.0-20.0 wt. % nickel; (xxi) 20.0-21.0 wt. % nickel; (xxii) 21.0-22.0 wt. % nickel; (xxiii) 22.0-23.0 wt. % nickel;

(xxiv) 23.0-24.0 wt. % nickel; (xxv) 24.0-25.0 wt. % nickel; (xxvi) 25.0-26.0 wt. % nickel; (xxvii) 26.0-27.0 wt. % nickel; (xxviii) 27.0-28.0 wt. % nickel; (xxix) 28.0-29.0 wt. % nickel; (xxx) 29.0-30.0 wt. % nickel; (xxxi) 30.0-31.0 wt. % nickel; (xxxii) 31.0-32.0 wt. % nickel; (xxxiii) 32.0-33.0 wt. % nickel; (xxxiv) 33.0-34.0 wt. % nickel; (xxxv) 34.0-35.0 wt. % nickel; (xxxvi) 35.0-36.0 wt. % nickel; (xxxvii) 36.0-37.0 wt. % nickel; (xxxviii) 37.0-38.0 wt. % nickel; (xxxix) 38.0-39.0 wt. % nickel; (xl) 39.0-40.0 wt. % nickel; (xli) 40.0-41.0 wt. % nickel; (xlii) 41.0-42.0 wt. % nickel; (xliii) 42.0-43.0 wt % nickel; (xliv) 43.0-44.0 wt. % nickel; (xlv) 44.0-45.0 wt. % nickel; (xlvi) 45.0-46.0 wt. % nickel; (xlvii) >46.0 wt. % nickel.

The extraction cone preferably comprises stainless steel or an alloy comprising: (i) 0-1.0 wt. % molybdenum; (ii) 1.0-2.0 wt. % molybdenum; (iii) 2.0-3.0 wt. % molybdenum; (iv) 3.0-4.0 wt. % molybdenum; (v) 4.0-5.0 wt. % molybdenum; (vi) 5.0-6.0 wt. % molybdenum; (vii) 6.0-7.0 wt % molybdenum; (viii) 7.0-8.0 wt. % molybdenum; and (ix) >8.0 wt. % molybdenum.

The extraction cone preferably comprises stainless steel or an alloy comprising: (i) 0-1.0 wt. % copper; (ii) 1.0-2.0 wt. % copper; (iii) 2.0-3.0 wt. % copper; (iv) 3.0-4.0 wt. % copper; and (v) >4.0 wt % copper.

The extraction cone preferably comprises stainless steel or an alloy comprising: (i) 0.01-1.0 wt. % X; (ii) 1.0-2.0 wt. % X; (iii) 2.0-3.0 wt. % X; (iv) 3.0-4.0 wt. % X; and (v) >4.0 wt. % X; wherein X comprises cobalt and/or tantalum and/or aluminium and/or titanium and/or niobium and/or silicon and/or manganese and/or tungsten and/or phosphorous.

The extraction cone preferably forms an interface between a first or further vacuum chamber of the mass spectrometer and a second or further vacuum chamber of the mass spectrometer.

The extraction cone preferably comprises a first or inner conical or frusto-conical body defining a first orifice or circular aperture through which ions pass in use.

The first coating or surface is preferably provided on: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the first or inner conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the first or inner conical or frusta-conical body.

The extraction cone preferably further comprises a second or outer conical or frusto-conical body defining a second orifice or annular aperture, wherein the second orifice or annular aperture substantially circumscribes at least part or substantially the whole of the first orifice or circular aperture.

The first coating or surface is preferably provided on: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the second or outer conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the second or outer conical or frusto-conical body.

The first coating or surface is preferably selected from the group consisting of: (i) aluminium diboride, aluminium dodecaboride, $AlB_2$ or $AlB_{12}$; (ii) chromium diboride or $CrB_2$; (iii) copper boride; (iv) hafnium diboride or $HfB_2$; (v) iridium boride; (vi) iron boride, $FeB$ or $Fe_2B$; (vii) manganese boride, manganese diboride, $MnB$ or $MnB_2$; (viii) molybdenum diboride or $MoB_2$; (ix) nickel boride, $NiB$, $Ni_2B$ or $Ni_3B$; (x) niobium diboride or $NbB_2$; (xi) osmium boride; (xii) palladium boride; (xiii) platinum boride; (xiv) rhenium boride; (xv) rhodium boride; (xvi) ruthenium boride; (xvii) scandium boride or $ScB$; (xviii) silicon hexaboride, silicon tetraboride, $SiB_6$ or $SiB_4$; (xix) tantalum diboride or $TaB_2$; (xx) titanium diboride or $TiB_2$; (xxi) tungsten diboride or $WB_2$; (xxii) vanadium diboride or $VB_2$; (xxiii) yttrium boride; and (xxiv) zirconium diboride or $ZrB_2$.

The first coating or surface preferably comprises: (i) a transition metal boride or diboride; (ii) a boride or diboride alloy; or (iii) a mixed metal boride or diboride alloy.

The first coating or surface preferably has either:
(a) a resistivity selected from the group consisting of: (i) $<10^{-3}$ Ω-m; (ii) $<10^{-4}$ Ω-m; (iii) $<10^{-5}$ Ω-m; (iv) $<10^{-6}$ Ω-m; (v) $<10^{-7}$ Ω-m; (vi) $10^{-3}$-$10^{-4}$ Ω-m; (vii) $10^{-4}$-$10^{-5}$ Ω-m; (viii) $10^{-5}$-$10^{-6}$ Ω-m; and (ix) $10^{-6}$-$10^{-7}$ Ω-m; and/or
(b) a Vickers hardness number or Vickers Pyramid Number (HV) selected from the group consisting of: (i) >1000; (ii) 1000-1100; (iii) 1100-1200; (iv) 1200-1300; (v) 1300-1400; (vi) 1400-1500; (vii) 1500-1600; (viii) 1600-1700; (ix) 1700-1800; (x) 1800-1900; (xi) 1900-2000; (xii) 2000-2100; (xiii) 2100-2200; (xiv) 2200-2300; (xv) 2300-2400; (xvi) 2400-2500; (xvii) 2500-2600; (xviii) 2600-2700; (xix) 2700-2800; (xx) 2800-2900; (xxi) 2900-3000; (xxii) 3000-3100; (xxiii) 3100-3200; (xxiv) 3200-3300; (xv) 3300-3400; (xvi) 3400-3500; and (xvii) >3500, wherein the Vickers hardness number or Vickers Pyramid Number is determined at a load of 30, 40, 50, 60 or 70 kg; and/or
(c) a Vickers microhardness selected from the group consisting of: (i) >1000 kg/mm; (ii) 1000-1100 kg/mm; (iii) 1100-1200 kg/mm; (iv) 1200-1300 kg/mm; (v) 1300-1400 kg/mm; (vi) 1400-1500 kg/mm; (vii) 1500-1600 kg/mm; (viii) 1600-1700 kg/mm; (ix) 1700-1800 kg/mm; (x) 1800-1900 kg/mm; (xi) 1900-2000 kg/mm; (xii) 2000-2100 kg/mm; (xiii) 2100-2200 (xiv) 2200-2300 kg/mm; (xv) 2300-2400 kg/mm; (xvi) 2400-2500 kg/mm; (xvii) 2500-2600 kg/mm; (xviii) 2600-2700 kg/mm; (xix) 2700-2800 kg/mm; (xx) 2800-2900 kg/mm; (xxi) 2900-3000 kg/mm; (xxii) 3000-3100 kg/mm; (xxiii) 3100-3200 kg/mm; (xxiv) 3200-3300 kg/mm; (xv) 3300-3400 kg/mm; (xvi) 3400-3500 kg/mm; and (xvii) >3500 kg/mm, and/or
(d) a thickness selected from the group consisting of: (i) <1 µm; (ii) 1-2 µm; (iii) 2-3 µm; (iv) 3-4 µm; (v) 4-5 µm; (vi) 5-6 µm; (vii) 6-7 µm; (viii) 7-8 µm; (ix) 8-9 µm; (x) 9-10 µm; (xi) >10 µm; and/or
(e) a density selected from the group consisting of: (i) <3.0 g cm$^{-3}$; (ii) g cm$^{-3}$; (iii) 3.5-4.0 g cm$^{-3}$; (iv) 4.0-4.5 g cm$^{-3}$; (v) 4.5-5.0 g cm$^{-3}$; (vi) 5.0-5.5 g cm$^{-3}$; (vii) 5.5-6.0 g cm$^{-3}$; (viii) 6.0-6.5 g cm$^{-3}$; (ix) 6.5-7.0 g cm$^{-3}$; (x) 7.0-7.5 g cm$^{-3}$; (xi) 7.5-8.0 g cm$^{-3}$; (xli) 8.0-8.5 g cm$^{-3}$; (xiii) 8.5-9.0 g cm$^{-3}$; (xiv) 9.0-9.5 g cm$^{-3}$; (xv) 9.5-10.0 g cm$^{-3}$; (xvi) 10.0-10.5 g cm$^{-3}$; (xvii) 10.5-11.0 g cm$^{-3}$: (xviii) 11.0-11.5 g cm$^{-3}$; (xix) 11.5-12.0 g cm$^{-3}$; (xx) 12.0-12.5 g cm$^{-3}$; (xxi) 12.5-13.0 g cm$^{-3}$; (xxii) 13.0-13.5 g cm$^{-3}$; (xxiii) 13.5-14.0 g cm$^{-3}$; (xxiv) 14.0-14.5 g cm$^{-3}$; (xxv) 14.5-15.0 g cm$^{-3}$; (xxvi) 15.0-15.5 g cm$^{-3}$; (xxvii) 15.5-16.0 g cm$^{-3}$; (xxviii) 16.0-16.5 g cm$^{-3}$; (xxix) 16.5-17.0 g cm$^{-3}$; (xxx) 17.0-17.5 g cm$^{-3}$; (xxxi) 17.5-18.0 g cm$^{-3}$; (xxxii) 18.0-18.5 g cm$^{-3}$; (xxxiii) 18.5-19.0 g cm$^{-3}$; (xxxiv) 19.0-19.5 g cm$^{-3}$; (xxxv) 19.5-20.0 g cm$^{-3}$; and (xxxvi) >20.0 g cm$^{-3}$; and/or
(f) a coefficient of friction selected from the group consisting of: (i) <0.01; (ii) 0.01-0.02; (iii) 0.02-0.03; (iv) 0.03-0.04; (v) 0.04-0.05; (vi) 0.05-0.06; (vii) 0.06-0.07; (viii) 0.07-0.08; (ix) 0.08-0.09; (x) 0.09-0.10; and (xi) >0.1.

According to an aspect of the present invention there is provided a method of mass spectrometry comprising:

passing ions through a sampling cone and/or a cone-gas cone of a mass spectrometer, wherein the sampling cone and/or the cone-gas cone comprises a first coating or surface provided on at least a portion of the sampling cone and/or the cone-gas cone, wherein the first coating or surface comprises a metallic boride coating or surface.

According to an aspect of the present invention there is provided a method of mass spectrometry comprising:

passing ions through an extraction cone of a mass spectrometer, wherein the extraction cone comprises a first coating or surface provided on at least a portion of the extraction cone, wherein the first coating or surface comprises a metallic boride coating or surface.

According to an aspect of the present invention there is provided a method of making a sampling cone and/or a cone-gas cone for a mass spectrometer comprising:

depositing, sputtering or forming a first coating or surface on at least a portion of a sampling cone and/or a cone-gas cone of a mass spectrometer, wherein the first coating or surface comprises a metallic boride coating or surface.

According to an aspect of the present invention there is provided a method of making an extraction cone for a mass spectrometer comprising:

depositing, sputtering or forming a first coating or surface on at least a portion of an extraction cone of a mass spectrometer, wherein the first coating or surface comprises a metallic boride coating or surface.

3) Ceramic and DLC

A Diamond Like Carbon ("DLC") coating is an amorphous carbon coating and differs therefore from diamond coatings which are polycrystalline. A DLC coating is conductive which is particularly advantageous compared with diamond coatings which are insulating and non-conductive.

A DLC coating also has a low coefficient of friction and is therefore highly non-stick. DLC coatings are also particularly robust and have a high hardness and have a high temperature resistance. The DLC coating is therefore particularly advantageous compared with graphite which will tend to oxidise at high temperatures.

The sampling cone and/or the cone-gas cone is preferably made from a material selected from the group consisting of: (i) stainless steel; (ii) a steel alloy comprising ≥11.5% chromium wt. %; (iii) an austenitic stainless steel; (iv) a ferritic stainless steel; (v) an austenitic-ferritic or duplex steel: (vi) titanium; (vii) a titanium alloy; (viii) a nickel-base alloy; (ix) a nickel-chromium alloy; (x) a nickel-chromium alloy comprising ≥50.0% nickel wt. %; and (xi) INCONEL™ 600, 625, 690, 702, 718, 939 or X750.

The sampling cone and/or the cone-gas cone preferably comprises stainless steel or an alloy comprising: (i) 0-0.01 wt. % carbon; (ii) 0.01-0.02 wt. % carbon; (iii) 0.02-0.03 wt. % carbon; (iv) 0.03-0.04 wt. % carbon; (v) 0.04-0.05 wt. % carbon; (vi) 0.05-0.06 wt. % carbon; (vii) 0.06-0.07 wt. % carbon; (viii) 0.07-0.08 wt. % carbon; and (ix) >0.08 wt. % carbon.

The sampling cone and/or the cone-gas cone preferably comprises stainless steel OF an alloy comprising: (i) 0-0.01 wt. % nitrogen; (ii) 0.01-0.02 wt. % nitrogen; (iii) 0.02-0.03 wt. % nitrogen; (iv) 0.03-0.04 wt. % nitrogen; (v) 0.04-0.05 wt. % nitrogen; (vi) 0.05-0.06 wt. % nitrogen; (vii) 0.06-0.07 wt. % nitrogen; and (viii) >0.07 wt. % nitrogen.

The sampling cone and/or the cone-gas cone preferably comprises stainless steel or an alloy comprising: (i) 0-0.1 wt. % nitrogen; (ii) 0.1-0.2 wt. % nitrogen; (iii) 0.2-0.3 wt. % nitrogen: (iv) 0.3-0.4 wt. % nitrogen; (v) 0.4-0.5 wt. % nitrogen; (vi) 0.5-0.6 wt. % nitrogen; (vii) 0.6-0.7 wt. % nitrogen; and (viii) >0.7 wt. % nitrogen.

The sampling cone and/or the cone-gas cone preferably comprises stainless steel or an alloy comprising: (i) 12.0-13.0 wt. % chromium; (ii) 13.0-14.0 wt. % chromium; (iii) 14.0-15.0 wt. % chromium; (iv) 15.0-16.0 wt. % chromium; (v) 16.0-17.0 wt. % chromium; (vi) 17.0-18.0 wt. % chromium; (vii) 18.0-19.0 wt. % chromium; (viii) 19.0-20.0 wt. % chromium; (ix) 20.0-21.0 wt. % chromium; (x) 21.0-22.0 wt. % chromium; (xi) 22.0-23.0 wt. % chromium; (xii) 23.0-24.0 wt. % chromium; (xiii) 24.0-25.0 wt. % chromium; (xiv) 25.0-26.0 wt. % chromium; (xv) 26.0-27.0 wt. % chromium; (xvi) 27.0-28.0 wt. % chromium; (xvii) 28.0-29.0 wt. % chromium; (xviii) 29.0-30.0 wt. % chromium; and (xix) >30.0 wt. % chromium.

The sampling cone and/or the cone-gas cone preferably comprises stainless steel or an alloy comprising: (i) 0-1.0 wt. % nickel; (ii) 1.0-2.0 wt. % nickel; (iii) 2.0-3.0 wt. % nickel; (iv) 3.0-4.0 wt. % nickel; (v) 4.0-5.0 wt. % nickel; (vi) 5.0-6.0 wt. % nickel; (vii) 6.0-7.0 wt. % nickel; (viii) 7.0-8.0 wt. % nickel; (ix) 8.0-9.0 wt. % nickel; (x) 9.0-10.0 wt. % nickel; (xi) 10.0-11.0 wt. % nickel; (xii) 11.0-12.0 wt. % nickel; (xiii) 12.0-13.0 wt. % nickel; (xiv) 13.0-14.0 wt. % nickel; (xv) 14.0-15.0 wt. % nickel; (xvi) 15.0-16.0 wt. % nickel; (xvii) 16.0-17.0 wt. % nickel; (xviii) 17.0-18.0 wt. % nickel; (xix) 18.0-19.0 wt. % nickel; (xx) 19.0-20.0 wt. % nickel; (xxi) 20.0-21.0 wt. % nickel; (xxii) 21.0-22.0 wt. % nickel; (xxiii) 22.0-23.0 wt. % nickel; (xxiv) 23.0-24.0 wt. % nickel; (xxv) 24.0-25.0 wt. % nickel; (xxvi) 25.0-26.0 wt. % nickel; (xxvii) 26.0-27.0 wt. % nickel; (xxviii) 27.0-28.0 wt. % nickel; (xxix) 28.0-29.0 wt. % nickel; (xxx) 29.0-30.0 wt. % nickel; (xxxi) 30.0-31.0 wt. % nickel; (xxxii) 31.0-32.0 wt. % nickel; (xxxiii) 32.0-33.0 wt. % nickel; (xxxiv) 33.0-34.0 wt. % nickel; (xxxv) 34.0-35.0 wt. % nickel; (xxxvi) 35.0-36.0 wt. % nickel; (xxxvii) 36.0-37.0 wt. % nickel; (xxxviii) 37.0-38.0 wt. % nickel; (xxxix) 38.0-39.0 wt. % nickel; (xi) 39.0-40.0 wt. % nickel; (xli) 40.0-41.0 wt. % nickel; (xlii) 41.0-42.0 wt. % nickel; (xiiii) 42.0-43.0 wt. % nickel; (xliv) 43.0-44.0 wt. % nickel; (xlv) 44.0-45.0 wt. % nickel; (xlvi) 45.0-46.0 wt. % nickel; (xlvii) >46.0 wt. % nickel.

The sampling cone and/or the cone-gas cone preferably comprises stainless steel or an alloy comprising: (i) 0-1.0 wt. % nitrogen; (ii) 1.0-2.0 wt. % molybdenum; (iii) 2.0-3.0 wt. % molybdenum; (iv) 3.0-4.0 wt. % molybdenum; (v) 4.0-5.0 wt. % molybdenum; (vi) 5.0-6.0 wt. % molybdenum; (vii) 6.0-7.0 wt. % molybdenum; (viii) 7.0-8.0 wt. % molybdenum; and (ix) >8.0 wt. % molybdenum.

The sampling cone and/or the cone-gas cone preferably comprises stainless steel or an alloy comprising: (i) 0-1.0 wt. % copper; (ii) 1.0-2.0 wt. % copper; (iii) 2.0-3.0 wt. % copper; (iv) 3.0-4.0 wt. % copper; and (v) >4.0 wt. % copper.

The sampling cone and/or the cone-gas cone preferably comprises stainless steel or an alloy comprising: (i) 0.01-1.0 wt. % X; (ii) 1.0-2.0 wt. % X; (iii) 2.0-3.0 wt. % X; (iv) 3.0-4.0 wt. % X; and (v) >4.0 wt. % X; wherein X comprises cobalt and/or tantalum and/or aluminium and/or titanium and/or niobium and/or silicon and/or manganese and/or tungsten and/or phosphorous.

The sampling cone and/or the cone-gas cone preferably forms an interface between an atmospheric pressure ion source and a first vacuum chamber of the mass spectrometer.

The sampling cone preferably comprises a first or inner conical or frusto-conical body defining a first orifice or circular aperture through which ions pass in use.

The first coating or surface is preferably provided on: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the first or inner conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the first or inner conical or frusto-conical body.

The cone-gas cone preferably comprises a second or outer conical or frusto-conical body defining a second orifice or annular aperture through which a cone gas emerges, in use, and wherein the second orifice or annular aperture substantially circumscribes at least part or substantially the whole of the first orifice or circular aperture.

The first coating or surface is preferably provided on: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the second or outer conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the second or outer conical or frusto-conical body.

According to another aspect of the present invention there is provided a mass spectrometer comprising an extraction cone, wherein the extraction cone comprises a first coating or surface provided on at least a portion of the extraction cone, wherein the first coating or surface Comprises a ceramic coating or surface or a Diamond Like Carbon ("DLC") coating or surface.

The extraction cone is preferably made from a material selected from the group consisting of: (i) stainless steel; (ii) a steel alloy comprising ≥11.5% chromium wt. %; (iii) an austenitic stainless steel; (iv) a ferritic stainless steel; (v) an austenitic-ferritic or duplex steel; (vi) titanium; (vii) a titanium alloy; (viii) a nickel-base alloy; (ix) a nickel-chromium alloy; (x) a nickel-chromium alloy comprising ≥50.0% nickel wt. %; and (xi) INCONEL™ 600, 625, 690, 702, 718, 939 or X750.

The extraction cone preferably comprises stainless steel or an alloy comprising: (i) 0-0.01 wt. % carbon; (ii) 0.01-0.02 wt. % carbon; (iii) 0.02-0.03 wt. % carbon; (iv) 0.03-0.04 wt. % carbon; (v) 0.04-0.05 wt. % carbon; (vi) 0.05-0.06 wt. % carbon; (vii) 0.06-0.07 wt. % carbon; (viii) 0.07-0.08 wt. % carbon; and (ix) >0.08 wt. % carbon.

The extraction cone preferably comprises stainless steel or an alloy comprising: (i) 0-0.01 wt. % nitrogen; (ii) 0.01-0.02 wt. % nitrogen; (iii) 0.02-0.03 wt. % nitrogen; (iv) 0.03-0.04 wt. % nitrogen; (v) 0.04-0.05 wt. % nitrogen; (vi) 0.05-0.06 wt. % nitrogen; (vii) 0.06-0.07 wt. % nitrogen; and (viii) >0.07 wt. % nitrogen.

The extraction cone preferably comprises stainless steel or an alloy comprising: (i) 0-0.1 wt. % nitrogen; (ii) 0.1-0.2 wt. % nitrogen; (iii) 0.2-0.3 wt. % nitrogen; (iv) 0.3-0.4 wt. % nitrogen; (v) (14-0.5 wt. % nitrogen; (vi) 0.5-0.6 wt. % nitrogen; (vii) 0.6-0.7 wt. % nitrogen; and (viii) >0.7 wt. % nitrogen.

The extraction cone preferably comprises stainless steel or an alloy comprising: (i) 12.0-13.0 wt. % chromium; (ii) 13.0-14.0 wt. % chromium; (iii) 14.0-15.0 wt. % chromium; (iv) 15.0-16.0 wt. % chromium; (v) 16.0-17.0 wt. % chromium; (vi) 17.0-18.0 wt. % chromium; (vii) 18.0-19.0 wt. % chromium; (viii) 19.0-20.0 wt. % chromium; (ix) 20.0-21.0 wt. % chromium; (x) 21.0-22.0 wt. % chromium; (xi) 22.0-23.0 wt. % chromium; (xii) 23.0-24.0 wt. % chromium; (xiii) 24.0-25.0 wt. % chromium; (xiv) 25.0-26.0 wt. % chromium; (xv) 26.0-27.0 wt. % chromium; (xvi) 27.0-28.0 wt. % chromium; (xvii) 28.0-29.0 wt. % chromium (xviii) 29.0-30.0 wt. % chromium; and (xix) >30.0 wt. % chromium.

The extraction cone preferably comprises stainless steel or an alloy comprising: (i) 0-1.0 wt. % nickel; (ii) 1.0-2.0 wt % nickel; (iii) 2.0-3.0 wt. % nickel; (iv) 3.0-4.0 wt. % nickel; (v) 4.0-5.0 wt. % nickel; (vi) 5.0-6.0 wt. % nickel; (vii) 6.0-7.0 wt. % nickel; (viii) 7.0-8.0 wt. % nickel; (ix) 8.0-9.0 wt. % nickel; (x) 9.0-10.0 wt. % nickel; (xi) 10.0-11.0 wt. % nickel; (xii) 11.0-12.0 wt. % nickel; (xiii) 12.0-13.0 wt. % nickel; (xiv) 13.0-14.0 wt. % nickel; (xv) 14.0-15.0 wt. % nickel; (xvi) 15.0-16.0 wt. % nickel; (xvii) 16.0-17.0 wt. % nickel; (xviii) 17.0-18.0 wt. % nickel; (xix) 18.0-19.0 wt. % nickel; (xx) 19.0-20.0 wt. % nickel; (xxi) 20.0-21.0 wt. % nickel; (xxii) 21.0-22.0 wt. % nickel; (xxiii) 22.0-23.0 wt. % nickel; (xxiv) 23.0-24.0 wt. % nickel; (xxv) 24.0-25.0 wt. % nickel; (xxvi) 25.0-26.0 wt. % nickel; (xxvii) 26.0-27.0 wt. % nickel; (xxviii) 27.0-28.0 wt. % nickel; (xxix) 28.0-29.0 wt. % nickel; (xxx) 29.0-30.0 wt. % nickel; (xxxi) 30.0-31.0 wt. % nickel; (xxxii) 31.0-32.0 wt. % nickel; (xxxiii) 32.0-33.0 wt. % nickel; (xxxiv) 33.0-34.0 wt. % nickel; (xxxv) 34.0-35.0 wt. % nickel; (xxxvi) 35.0-36.0 wt. % nickel; (xxxvii) 36.0-37.0 wt. % nickel; (xxxviii) 37.0-38.0 wt. % nickel; (xxxix) 38.0-39.0 wt. % nickel; (xl) 39.0-40.0 wt. % nickel; (xli) 40.0-41.0 wt. % nickel; (xlii) 41.0-42.0 wt. % nickel; (xliii) 42.0-43.0 wt. % nickel; (xliv) 43.0-44.0 wt. % nickel; (xlv) 44.0-45.0 wt. % nickel; (xlvi) 45.0-46.0 wt. % nickel; (xlvii) >46.0 wt. % nickel.

The extraction cone preferably comprises stainless steel or an alloy comprising: (i) 0-1.0 wt. % molybdenum; (ii) 1.0-2.0 wt. % molybdenum; (iii) 2.0-3.0 wt. % molybdenum; (iv) 3.0-4.0 wt. % molybdenum; (v) 4.0-5.0 wt. % molybdenum; (vi) 5.0-6.0 wt. % molybdenum; (vii) 6.0-7.0 wt. % molybdenum; (viii) 7.0-8.0 wt. % molybdenum; and (ix) >8.0 wt. % molybdenum.

The extraction cone preferably comprises stainless steel or an alloy comprising: (i) 0-1.0 wt. % copper; (ii) 1.0-2.0 wt. % copper; (iii) 2.0-3.0 wt. % copper; (iv) 3.0-4.0 wt. % copper; and (v) >4.0 wt. % copper.

The extraction cone preferably comprises stainless steel or an alloy comprising: (i) 0.01-1.0 wt. % X; (ii) 1.0-2.0 wt. % X; (iii) 2.0-3.0 wt. % X; (iv) 3.0-4.0 wt. % X; and (v) >4.0 wt. % X; wherein X comprises cobalt and/or tantalum and/or aluminium and/or titanium and/or niobium and/or silicon and/or manganese and/or tungsten and/or phosphorous.

The extraction cone preferably forms an interface between a first or further vacuum chamber of the mass spectrometer and a second or further vacuum chamber of the mass spectrometer.

The extraction cone preferably comprises a first or inner conical or frusto-conical body defining a first orifice or circular aperture through which ions pass in use.

The first coating or surface is preferably provided on: (i) at feast 5%, 10%, 15%, 20%, 25%, 30%, 35%, 40%, 45%, 50%, 55%, 60%, 65%, 70%, 75%, 80%, 85%, 90%, 95% or 100% of an outer surface of the first or inner conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the first or inner conical or frusto-conical body.

The extraction cone preferably further comprises a second or outer conical or frusto-conical body defining a second orifice or annular aperture, wherein the second orifice or annular aperture substantially circumscribes at least part or substantially the whole of the first orifice or circular aperture.

The first coating or surface is preferably provided on: (i) at least 5%, 10%, 15%, 20%, 25%, 30%, 35%, 40%, 45%, 50%, 55%, 60%, 65%, 70%, 75%, 80%, 86%, 90%, 95% or 100% of an outer surface of the second or outer conical or frusto-conical body; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the second or outer conical or frusto-conical body.

The Diamond Like Carbon coating preferably comprises a SP2 (graphite) to SP3 (diamond) ratio selected from the group consisting of: (i) <0.1; (ii) 0.1-0.2; (iii) 0.2-0.3; (iv) 0.3-0.4; (v) 0.4-0.5; (vi) 0.5-0.6; (vii) 0.6-0.7; (viii) 0.7-0.8; (ix) 0.8-0.9; and (x) 0.9-1.0.

The Diamond Like Carbon coating or surface comprises a carbon coating or surface having a diamond-like structure.

The Diamond Like Carbon coating or surface preferably further comprises a metal component such as chromium.

The ceramic coating or surface preferably comprises silicon carbide or SiC.

The first coating or surface preferably has either:

(a) a resistivity selected from the group consisting of: (i) $<10^{-3}$ Ω-m; (ii) $<10^{-4}$ Ω-m; (iii) $<10^{-5}$ Ω-m; (iv) $<10^{-6}$ Ω-m; (v) $<10^{-7}$ Ω-m; (vi) $10^{-3}$-$10^{-4}$ Ω-m; (vii) $10^{-4}$-$10^{-6}$ Ω-m; (viii) $10^{-6}$-$10^{-6}$ Ω-m; and (ix) $10^{-6}$-$10^{-4}$ Ω-m; and/or (b) a Vickers hardness number or Vickers Pyramid Number (HV) selected from the group consisting of: (i) >1000; (ii) 1000-1100; (iii) 1100-1200; (iv) 1200-1300; (v) 1300-1400; (vi) 1400-1500; (vii) 1500-1600; (viii) 1600-1700; (ix) 1700-1800; (x) 1800-1900; (xi) 1900-2000; (xii) 2000-2100; (xiii) 2100-2200; (xiv) 2200-2300; (xv) 2300-2400; (xvi) 2400-2500; (xvii) 2500-2600; (xviii) 2600-2700; (xix) 2700-2800; (xx) 2800-2900; (xxi) 2900-3000; (xxii) 3000-3100; (xxiii) 3100-3200; (xxiv) 3200-3300; (xv) 3300-3400; (xvi) 3400-3500; and (xvii) >3500, wherein the Vickers hardness number or Vickers Pyramid Number is determined at a load of 30, 40, 50, 60 or 70 kg; and/or (c) a Vickers microhardness selected from the group consisting of: (i) >1000 kg/mm; (ii) 1000-1100 kg/mm; (iii) 1100-1200 kg/mm; (iv) 1200-1300 kg/mm; (v) 1300-1400 kg/mm; (vi) 1400-1500 kg/mm; (vii) 1500-1600 kg/mm; (viii) 1600-1700 kg/mm; (ix) 1700-1800 kg/mm; (x) 1800-1900 kg/mm; (xi) 1900-2000 kg/mm; (xii) 2000-2100 kg/mm; (mil) 2100-2200 kg/mm; (xiv) 2200-2300 kg/mm; (xv) 2300-2400 kg/mm; (xvi) 2400-2500 kg/mm; (xvii) 2500-2600 kg/mm; (xviii) 2600-2700 kg/mm; (xix) 2700-2800 kg/mm; (xx) 2800-2900 kg/mm; (xxi) 2900-3000 kg/mm; (xxii) 3000-3100 kg/mm; (xxiii) 3100-3200 kg/mm; (xxiv) 3200-3300 kg/mm; (xv) 3300-3400 kg/mm; (xvi) 3400-3500 kg/mm; and (xvii) >3500 kg/mm, and/or (d) a thickness selected from the group consisting of: (i) <1 μm; (ii) 1-2 μm; (iii) 2-3 μm; (iv) 3-4 μm; (v) 4-5 μm; (vi) 5-6 μm; (vii) 6-7 μm; (viii) 7-8 μm; (ix) 8-9 μm; (x) 9-10 μm; (xi) >10 μm; and/or (e) a density selected from the group consisting of: (i) <3.0 g cm$^{-3}$; (ii) 3.0-3.5 g cm$^{-3}$; (iii) 3.5-4.0 g cm$^{-3}$; (iv) 4.0-4.5 g cm$^{-3}$; (v) 4.5-5.0 g cm$^{-3}$; (vi) 5.0-5.5 g cm$^{-3}$; (vii) 5.5-6.0 g cm$^{-3}$; (viii) 6.0-6.5 g cm$^{-3}$; (ix) 6.5-7.0 g cm$^{-3}$; (x) 7.0-7.5 g cm$^{-3}$; (xi) 7.5-8.0 g cm$^{-3}$; (xii) 8.0-8.5 g cm$^{-3}$; (xiii) 8.5-9.0 g cm$^{-3}$; (xiv) 9.0-9.5 g cm$^{-3}$; (xv) 9.5-10.0 g cm$^{-3}$; (xvi) 10.0-10.5 g cm$^{-3}$; (xvii) 10.5-11.0 g cm$^{-3}$; (xviii) 11.0-11.5 g cm$^{-3}$; (xix) 11.5-12.0 g cm$^{-3}$; (xx) 12.0-12.5 g cm$^{-3}$; (xxi) 12.5-13.0 g cm$^{-3}$; (xxii) 13.0-13.5 g cm$^{-3}$; (xxiii) 13.5-14.0 g cm$^{-3}$; (xxiv) 14.0-14.5 g cm$^{-3}$; (xxv) 14.5-15.0 g cm$^{-3}$; (xxvi) 15.0-15.5 g cm$^{-3}$; (xxvii) 15.5-16.0 g cm$^{-3}$; (xxviii) 16.0-16.5 g cm$^{-3}$; (xxix) 16.5-17.0 g cm$^{-3}$; (xxx) 17.0-17.5 g cm$^{-3}$; (xxxi) 17.5-18.0 g cm$^{-3}$; (xxxii) 18.0-18.5 g cm$^{-3}$; (xxxiii) 18.5-19.0 g cm$^{-3}$; (xxxiv) 19.0-19.5 g cm$^{-3}$; (xxxv) 19.5-20.0 g cm$^{-3}$; and (xxxvi) >20.0 g cm$^{-3}$; and/or (f) a coefficient of friction selected from the group consisting of: (i) <0.01; (ii) 0.01-0.02; (iii) 0.02-0.03; (iv) 0.03-0.04: (v) 0.04-0.05; (vi) 0.05-0.06; (vii) 0.06-0.07; (viii) 0.07-0.08; (ix) 0.08-0.09; (x) 0.09-0.10; and (xi) >0.1.

According to an aspect of the present invention there is provided a method of mass spectrometry comprising:

passing ions through a sampling cone and/or a cone-gas cone of a mass spectrometer, wherein the sampling cone and/or the cone-gas cone comprises a first coating or surface provided on at least a portion of the sampling cone and/or the cone-gas cone, wherein the first coating or surface comprises a ceramic coating or surface or a Diamond Like Carbon ("DLC") coating or surface.

According to an aspect of the present invention there is provided a method of mass spectrometry comprising:

passing ions through an extraction cone of a mass spectrometer, wherein the extraction cone comprises a first coating or surface provided on at least a portion of the extraction cone, wherein the first coating or surface comprises a ceramic coating or surface or a Diamond Like Carbon ("DLC") coating or surface.

According to an aspect of the present invention there is provided a method of making a sampling cone and/or a cone-gas cone for a mass spectrometer comprising:

depositing, sputtering or forming a first coating or surface on at least a portion of a sampling cone and/or a cone-gas cone of a mass spectrometer, wherein the first coating or surface comprises a ceramic coating or surface or a Diamond Like Carbon ("DLC") coating or surface.

According to an aspect of the present invention there is provided a method of making an extraction cone for a mass spectrometer comprising:

depositing, sputtering or forming a first coating or surface on at least a portion of an extraction cone of a mass spectrometer, wherein the first coating or surface comprises a ceramic coating or surface or a Diamond Like Carbon ("DLC") coating or surface.

The step of depositing, sputtering or forming the first coating or surface preferably comprises using a method selected from the group consisting of: (i) magnetron sputtering; (ii) closed field unbalanced magnetron sputter ion plating; (iii) electroplating; (iv) thermal spray coating; (v) vapour deposition; (vi) Chemical Vapour Deposition ("CVD"); (vii) combustion torch/flame spraying; (viii) electric arc spraying; (ix) plasma spraying; (x) ion plating; (xi) ion implantation; (xii) sputtering; (xiii) sputter deposition; (xiv) laser surface alloying; (xv) Physical Vapour Deposition ("PVD"); (xvi) plasma-based ion plating; (xvii) gas plasma discharge sputtering: (xviii) laser cladding; (xix) plasma enhanced Chemical Vapour Deposition; (xx) low pressure Chemical Vapour Deposition; (xxi) laser enhanced Chemical Vapour Deposition; (xxii) active reactive evaporation; (xxiii) Pulsed Laser Deposition ("PLD"); (xxiv) RF-sputtering; (xxv) ion-Beam Sputtering ("IBS"); (xxvi) reactive sputtering; (xxvii) Ion-Assisted Deposition ("IAD"); (xxviii) high target utilisation sputtering; (xxix) High Power Impulse Magnetron Sputtering ("HMS"); and (xxx) DC-sputtering.

The step of depositing, sputtering or forming the first coating or surface preferably comprises creating a glow or RF discharge to the sampling cone and/or the cone-gas cone and/or the extraction cone in an atmosphere containing a hydrocarbon gas, wherein the glow or RE discharge causes a breakdown of the hydrocarbon gas so that carbon from the gas is deposited on the sampling cone and/or the cone-gas cone and/or the extraction cone.

The step of depositing, sputtering or forming the first coating or surface preferably comprises applying a pulsed DC biased power supply to the sampling cone and/or the cone-gas cone and/or the extraction cone in an atmosphere containing a hydrocarbon gas, wherein the pulsed DC biased power supply preferably causes a breakdown of the hydrocarbon gas so that carbon from the gas is deposited on the sampling cone and/or the cone-gas cone and/or the extraction cone.

The hydrocarbon gas preferably comprises butane.

The step of depositing, sputtering or forming the first coating or surface preferably further comprises simultaneously depositing a metal with the deposition of carbon from the hydrocarbon gas to form a Diamond Like Carbon coating or surface including a metal therein. The metal preferably comprises chromium.

Depositing, sputtering or forming the first coating or surface optionally comprises using a method selected from the group consisting of: (i) magnetron sputtering; (ii) closed field unbalanced magnetron sputter ion plating; (iii) electroplating; (iv) thermal spray coating; (v) vapour deposition; (vi) Chemical Vapour Deposition ("CVD"); (vii) combustion torch/flame spraying; (viii) electric arc spraying; (ix) plasma spraying; (x) ion plating; (xi) ion implantation; (xii) sputtering; (xiii) sputter deposition; (xiv) laser surface alloying; (xv) Physical Vapour Deposition ("PVD"); (xvi) plasma-based ion plating; (xvii) gas plasma discharge sputtering; (xviii) laser cladding; (xix) plasma enhanced Chemical Vapour Deposition; (xx) low pressure Chemical Vapour Deposition; (xxi) laser enhanced Chemical Vapour Deposition; (xxii) active reactive evaporation; (xxii)) Pulsed Laser Deposition ("PLD"); (xxiv) RF-sputtering; (xxv) Ion-Beam Sputtering ("IBS"); (xxvi) reactive sputtering; (xxvii) Ion-Assisted Deposition ("IAD"); (xxviii) high target utilisation sputtering; (xxix) High Power Impulse Magnetron Sputtering ("HIPIMS"); and (xxx) DC-sputtering.

According to a preferred embodiment, a surface coating or a surface modification is preferably used to passivate the surfaces associated with an Atmospheric Pressure Ionisation ("API") ion source region and in particular the sampling cone and/or cone-gas cone and/or extraction cone of a mass spectrometer.

4) Ion-Implanted Transition Metal

The sampling cone and/or the cone-gas cone preferably forms an interface between an atmospheric pressure ion source and a first vacuum chamber of the mass spectrometer.

The sampling cone preferably comprises a first or inner conical or frusto-conical body defining a first orifice or circular aperture through which ions pass in use.

According to an embodiment: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the first or inner conical or frusto-conical body has been subjected to ion implantation; and/or (ii) at least 5%, 10%, 15%, 20%, 25%, 30%, 35%, 40%, 45%, 50%, 55%, 60%, 65%, 70%, 75%, 80%, 65%, 90%, 95% or 100% of an inner surface of the first or inner conical or frusto-conical body has been subjected to ion implantation.

The cone-gas cone preferably comprises a second or outer conical or frusto-conical body defining a second orifice or annular aperture through which a cone gas emerges, in use, and wherein the second orifice or annular aperture substantially circumscribes at least part or substantially the whole of the first orifice or circular aperture.

According to an embodiment: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the second or outer conical or frusto-conical body has been subjected to ion implantation; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the second or outer conical or frusto-conical body has been subjected to ion implantation.

According to another aspect of the present invention there is provided a mass spectrometer comprising an extraction cone formed from titanium which has been subjected to ion implantation.

The extraction cone preferably forms an interface between a first or further vacuum chamber of the mass spectrometer and a second or further vacuum chamber of the Mass spectrometer.

The extraction cone preferably comprises a first or inner conical or frusto-conical body defining a first orifice or circular aperture through which ions pass in use.

According to an embodiment: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the first or inner conical or frusto-conical body has been subjected to ion implantation; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the first or inner conical or frusto-conical body has been subjected to ion implantation.

The extraction cone preferably further comprises a second or outer conical or frusto-conical body defining a second orifice or annular aperture, wherein the second orifice or annular aperture substantially circumscribes at least part or substantially the whole of the first orifice or circular aperture.

According to an embodiment: (i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of the second or outer conical or frusto-conical body has been subjected to ion implantation; and/or (ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of the second or outer conical or frusto-conical body has been subjected to ion implantation.

The sampling cone and/or the cone-gas cone and/or the extraction cone preferably comprise titanium which has been subjected to ion implantation with ions selected from the group consisting of: (i) nitrogen; (ii) carbon; (iii) boron; (iv) oxygen; (v) argon; (vi) calcium; (vii) phosphorous; (viii) carbon-oxygen; (ix) neon; (x) sodium; (xi) chromium; (xii) vanadium; and (xii) fluorine.

The sampling cone and/or the cone-gas cone and/or the extraction cone is preferably subjected to an ion implantation dose selected from the group consisting of: (i) $10^{13}$ ions/cm$^2$; (ii) $10^{13}$-$10^{14}$ ions/cm$^2$; (iii) $10^{14}$-$10^{15}$ ions/cm$^2$, (iv) $10^{15}$-$10^{16}$ ions/cm$^2$; (v) $10^{16}$-$10^{17}$ ions/cm$^2$; (vi) $10^{17}$-$10^{18}$ ions/cm$^2$; and (vii) >$10^{16}$ ions/cm$^2$.

The surface of the sampling cone and/or the cone-gas cone and/or the extraction cone which has been subjected to ion implantation preferably has either;
(a) a resistivity selected from the group consisting of: (i) <$10^{-3}$ Ω-m; (ii) <$10^{-4}$ Ω-m; (iii) <$10^{-5}$ Ω-m; (iv) <$10^{-6}$ Ω-m; (v) <$10^{-7}$ Ω-m; (vi) $10^{-3}$-10 Ω-m; (vii) $10^{-4}$-$10^{-5}$ (viii) $10^{-5}$-$10^{-6}$Ω-m; and (ix) $10^{-6}$-$10^{-7}$ Ω-m; and/or
(b) a Vickers hardness number or Vickers Pyramid Number (HV) selected from the group consisting of: (i) >1000; (ii) 1000-1100; (iii) 1100-1200; (iv) 1200-1300; (v) 1300-1400; (vi) 1400-1500; (vii) 1500-1600; (viii)

1600-1700; (ix) 1700-1800; (x) 1800-1900; (xi) 1900-2000; (xii) 2000-2100; (xiii) 2100-2200; (xiv) 2200-2300; (xv) 2300-2400; (xvi) 2400-2500; (xvii) 2500-2600; (xviii) 2600-2700; (xix) 2700-2800; (xx) 2800-2900; (xxi) 2900-3000; (xxii) 3000-3100; (xxiii) 3100-3200; (xxiv) 3200-3300; (xv) 3300-3400; (xvi) 3400-3500; and (vii) >3500, wherein the Vickers hardness number or Vickers Pyramid Number is determined at a load of 30, 40, 50, 60 or 70 kg; and/or (c) a Vickers microhardness selected from the group consisting of: (i) >1000 kg/mm; (ii) 1000-1100 kg/mm; (iii) 1100-1200 kg/mm; (iv) 1200-1300 kg/mm; (v) 1300-1400 kg/mm; (vi) 1400-1500 kg/mm; (vii) 1500-1600 kg/mm; (viii) 1600-1700 kg/mm; (ix) 1700-1800 kg/mm; (x) 1800-1900 kg/mm; (xi) 1900-2000 kg/mm; (xii) 2000-2100 kg/mm; (xiii) 2100-2200 kg/mm; (xiv) 2200-2300 kg/mm; (xv) 2300-2400 kg/mm; (xvi) 2400-2500 kg/mm; (xvii) 2500-2600 kg/mm; (xviii) 2600-2700 kg/mm; (xix) 2700-2800 kg/mm; (xx) 2800-2900 kg/mm; (xxi) 2900-3000 kg/mm; (xxii) 3000-3100 kg/mm; (xxiii) 3100-3200 kg/mm; (xxiv) 3200-3300 kg/mm; (xv) 3300-3400 kg/mm; (xvi) 3400-3500 kg/mm; and (xvii) >3500 kg/mm, and/or (d) a thickness selected from the group consisting of: (i) <1 μm; (ii) 1-2 μm; (iii) 2-3 μm; (iv) 3-4 μm; (v) 4-5 μm; (vi) 5-6 μm; (vii) 6-7 μm; (viii) 7-8 μm; (ix) 8-9 μm; (x) 9-10 μm; (xi) >10 μm; and/or (e) a density selected from the group consisting of: (i) <3.0 g cm$^{-3}$; (ii) 3.0-3.5 g cm$^{-3}$; (iii) 3.5-4.0 g cm$^{-3}$; (iv) 4.0-4.5 g cm$^{-3}$; (v) 4.5-5.0 g cm$^{-3}$; (vi) 5.0-5.5 g cm$^{-3}$; (vii) 5.5-6.0 g cm$^{-3}$; (viii) 6.0-6.5 g cm$^{-3}$; (ix) 6.5-7.0 g cm$^{-3}$; (x) 7.0-7.5 g cm$^{-3}$; (xi) 7.5-8.0 g cm$^{-3}$; (xii) 8.0-8.5 g cm$^{-3}$; (xiii) 8.5-9.0 g cm$^{-3}$; (xiv) 9.0-9.5 g cm$^{-3}$; (xv) 9.5-10.0 g cm$^{-3}$; (xvi) 10.0-10.5 g cm$^{-3}$; (xvii) 10.5-11.0 g cm$^{-3}$; (xviii) 11.0-11.5 g cm$^{-3}$; (xix) 11.5-12.0 g cm$^{-3}$; (xx) 12.0-12.5 g cm$^{-3}$; (xxi) 12.5-13.0 g cm$^{-3}$; (xxii) 13.0-13.5 g cm$^{-3}$; (xxiii) 13.5-14.0 g cm$^{-3}$; (xxiv) 14.0-14.5 g cm$^{-3}$; (xxv) 14.5-15.0 g cm$^{-3}$; (xxvi) 15.0-15.5 g cm$^{-3}$; (xxvii) 15.5-16.0 g cm$^{-3}$; (xxviii) 16.0-16.5 g cm$^{-3}$; (xxix) 16.5-17.0 g cm$^{-3}$; (xxx) 17.0-17.5 g cm$^{-3}$; (xxxi) 17.5-18.0 g cm$^{-3}$; (xxxii) 18.0-18.5 g cm$^{-3}$; (xxxiii) 18.5-19.0 g cm$^{-3}$; (xxxiv) 19.0-19.5 g cm$^{-3}$; (xxxv) 19.5-20.0 g cm$^{-3}$; and (xxxvi) >20.0 g cm$^{-3}$; and/or (f) a coefficient of friction selected from the group consisting of: (i) <0.01; (ii) 0.01-0.02; (iii) 0.02-0.03; (iv) 0.03-0.04; (v) 0.04-0.05; (vi) 0.05-0.06; (vii) 0.06-0.07; (viii) 0.07-0.08; (ix) 0.08-0.09; (x) 0.09-0.10; and (xi) >0.1.

According to an aspect of the present invention there is provided a method of mass spectrometry comprising:
passing ions through a sampling cone and/or a cone-gas cone of a mass spectrometer, wherein the sampling cone and/or the cone-gas cone is formed from titanium which has been subjected to ion implantation.

According to an aspect of the present invention there is provided a method of mass spectrometry comprising:
passing ions through an extraction cone of a mass spectrometer, wherein the extraction cone is formed from titanium which has been subjected to ion implantation.

According to an aspect of the present invention there is provided a method of making a sampling cone and/or a cone-gas cone for a mass spectrometer comprising:
forming a sampling cone and/or a cone-gas cone of a mass spectrometer from titanium; and
subjecting the sampling cone and/or the cone-gas cone to ion implantation.

According to an aspect of the present invention there is provided a method of making an extraction cone for a mass spectrometer comprising:
forming an extraction cone of a mass spectrometer from titanium; and
subjecting the extraction cone to ion implantation.

The method preferably further comprises subjecting the sampling cone and/or the cone-gas cone and/or the extraction cone to an ion implantation dose selected from the group consisting of: (i) <10$^{13}$ ions/cm$^2$; (ii) 10$^{13}$-10$^{14}$ ions/cm$^2$; (iii) 10$^{14}$-10$^{15}$ ions/cm$^2$; (iv) 10$^{15}$-10$^{16}$ ions/cm$^2$; (v) 10$^{16}$-10$^{17}$ ions/cm$^2$; (vi) 10$^{17}$-10$^{18}$ ions/cm$^2$; and (vii) >10$^{18}$ ions/cm$^2$.

The method preferably further comprises accelerating ions to be implanted into the sampling cone and/or the cone-gas cone and/or the extraction cone to a kinetic energy selected from the group consisting of: (i) <10 keV; (ii) 10-50 keV; (iii) 50-100 keV; (iv) 100-150 keV; (v) 150-200 keV; (vi) 200-250 keV; (vii) 250-300 keV; (viii) 300-350 keV; (ix) 350-400 keV; (x) 400-450 keV; (xi) 450-500 keV; and (xii) >500 keV.

According to another aspect of the present invention there is provided a mass spectrometer comprising a sampling cone and/or a cone-gas cone formed from a transition metal which has been subjected to ion implantation.

According to another aspect of the present invention there is provided a mass spectrometer comprising an extraction cone formed from a transition metal which has been subjected to ion implantation.

The transition metal is preferably selected from the group consisting of: (i) scandium; (ii) titanium; (iii) vanadium; (iv) chromium; (v) manganese; (vi) iron; (vii) cobalt; (viii) nickel; (ix) copper; (x) zinc; (xi) yttrium; (xii) zirconium; (xiii) niobium; (xiv) molybdenum; (xv) technetium; (xvi) ruthenium; (xvii) rhodium; (xviii) palladium; (xix) silver; (xx) cadmium; (xxi) lanthanum; (xxii) hafnium; (xxiii) tantalum; (xxiv) tungsten; (xxv) rhenium; (xxvi) osmium; (xxvii) iridium; (xxviii) platinum; and (xxix) gold.

According to another aspect of the present invention there is provided a method of mass spectrometry comprising:
passing ions through a sampling cone and/or a cone-gas cone of a mass spectrometer, wherein the sampling cone and/or the cone-gas cone is formed from a transition metal which has been subjected to ion implantation.

According to another aspect of the present invention there is provided a method of mass spectrometry comprising:
passing ions through an extraction cone of a mass spectrometer, wherein the extraction cone is formed from a transition metal which has been subjected to ion implantation.

According to another aspect of the present invention there is provided a method of making a sampling cone and/or a cone-gas cone for a mass spectrometer comprising:
forming a sampling cone and/or a cone-gas cone of a mass spectrometer from a transition metal; and
subjecting the sampling cone and/or the cone-gas cone to ion implantation.

According to another aspect of the present invention there is provided a method of making an extraction cone for a mass spectrometer comprising:
forming an extraction cone of a mass spectrometer from a transition metal; and
subjecting the extraction cone to ion implantation.

The transition metal is preferably selected from the group consisting of: (i) scandium; (ii) titanium; (iii) vanadium; (iv) chromium; (v) manganese; (vi) iron; (vii) cobalt; (viii) nickel; (ix) copper; (x) zinc; (xi) yttrium; (xii) zirconium; (xiii) niobium; (xiv) molybdenum; (xv) technetium; (xvi) ruthenium; (xvii) rhodium; (xviii) palladium; (xix) silver; (xx) cadmium;

(xxi) lanthanum; (xxii) hafnium; (xxiii) tantalum; (xxiv) tungsten; (xxv) rhenium; (xxvi) osmium; (xxvii) iridium; (xviii) platinum; and (xxix) gold.

According to a preferred embodiment of the present invention a sampling cone and/or cone-gas cone and/or extraction cone of a mass spectrometer is preferably used to passivate the surfaces associated with an Atmospheric Pressure Ionisation ("API") ion source region.

The preferred embodiment preferably improves the robustness of the sampling cone and/or cone-gas cone and/or extraction cone by reducing surface reactions with ions and/or molecules as ions flow from an atmospheric pressure region to the vacuum chambers of a mass spectrometer. The improved sampling cone and/or cone-gas cone and/or extraction cone preferably has a greater durability, greater resistance to scratching, provides a robust inert surface that reduces the decomposition of contaminants, solvents, and unwanted compounds and is readily cleaned (chemically) without damage or degradation to the inert surface character.

The preferred surface coating or surface modification preferably improves the robustness of the sampling cone and/or cone-gas cone and/or extraction cone by reducing surface reactions with ions and/or molecules as ions flow from an atmospheric pressure region to the vacuum chambers of a mass spectrometer. The improved sampling cone and/or cone-gas cone and/or extraction cone preferably has a greater durability, greater resistance to scratching, provides a robust inert surface that reduces the decomposition of contaminants, solvents, and unwanted compounds and is readily cleaned (chemically) without damage or degradation to the inert surface character.

The preferred sampling cone and/or cone-gas cone and/or extraction cone preferably exhibits improved performance characteristics when compared with conventional stainless steel sampling cones, cone-gas cones and extraction cones.

The coated surface preferably advantageously reduces adsorption of material on contact with the surface since if material is deposited onto the surface of the sampling cone, cone-gas cone or extraction cone then it may result in a reduction in signal transmission and may cause an increase in the noise.

Comparative data is presented which shows the differences in intensity and peak area which are observed when using a newly cleaned stainless steel sampling cone/skimmer cone, an aged (or used) stainless steel sampling cone/skimmer cone and an aged (or used) sampling cone/skimmer cone which has been adapted according to the preferred embodiment to have a surface coating.

The sampling cone/skimmer cone according to the preferred embodiment maintains its signal transmission while slightly increasing its noise levels (after an extended time period of intermittent use) relative to the cleaned stainless steel sampling cone/skimmer cone. The aged or used stainless steel sampling cone/skimmer cone drops by a greater amount (after an extended time period of intermittent use) and the noise level also increases more significantly.

Optionally, a sampling cone, skimmer cone and cone-gas cone which have a surface coating according to the preferred embodiment only require an organic/acid wash whereas a conventional stainless steel sampling cone, con-gas cone and extraction cone may require abrasive cleaning.

BRIEF DESCRIPTION OF THE DRAWINGS

Various embodiments will now be described, by way of example only, and with reference to the accompanying drawings in which:

FIG. 2 shows the signal intensity factor difference obtained according to an embodiment of the present invention comparing the intensity of ion signals relating to six compounds obtained using cleaned stainless steel sampling and extraction cones and sampling and extraction cones coated with titanium carbide against an aged stainless steel cone set which was assigned a unity factor;

FIG. 4 shows the peak area factor difference for each of the six compounds with the aged stainless steel cone set being assigned a unity factor; and FIG. 5 shows a table of the signal to noise factor difference for the six compounds with the aged stainless steel cone set being assigned a unity factor.

DETAILED DESCRIPTION

The following describes some embodiments that entail a surface coating or layer on a sampling cone, cone-gas cone and/or extraction cone of a mass spectrometer.

Figure 1:
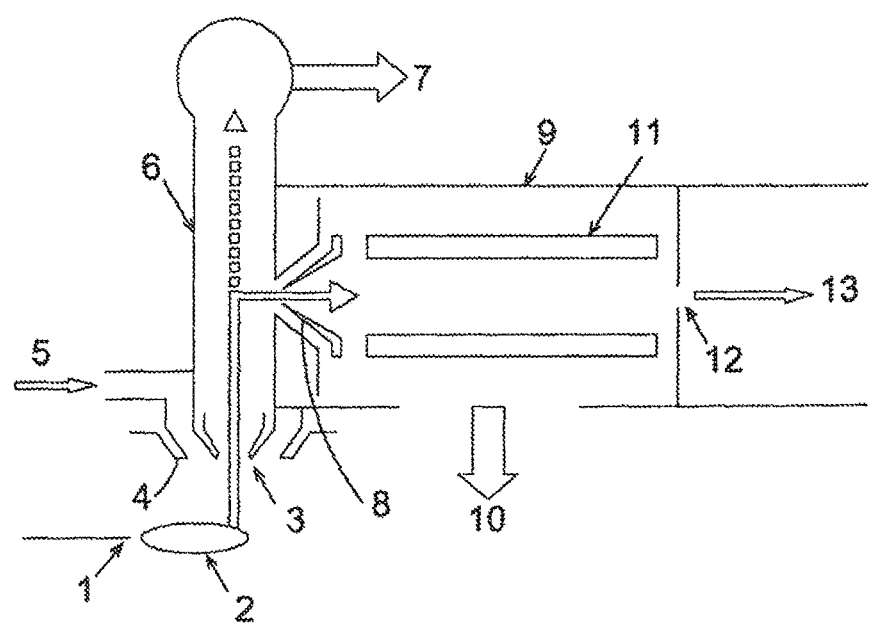
FIG. 1 shows the initial vacuum stages of a mass spectrometer comprising a sampling cone and a cone-gas cone at the entrance to a first vacuum chamber.

A preferred embodiment will now be described in more detail with reference to FIG. 1. FIG. 1 shows the initial vacuum stages of a mass spectrometer and an Electrospray capillary 1 which forms part of an Electrospray ion source which emits, in use, an ion plume 2. Ions and neutral gas molecules are drawn through a sampling cone 3 into the first vacuum chamber 6 of a mass spectrometer. A cone-gas cone 4 surrounds the sampling cone 3 and a cone gas or curtain gas 5 is preferably supplied to the cone-gas cone 4. Neutral gas molecules continue through the first vacuum chamber 6 which is preferably evacuated by a rough pump 7 such as a rotary pump or scroll pump. The rough pump, rotary pump or scroll pump serves to provide the backing pressure to a second vacuum chamber 9 which is preferably pumped by a fine pump such as a turbomolecular pump or diffusion pump. The term "backing pressure" refers to the pressure in the first vacuum chamber 6. Ions are preferably diverted in an orthogonal direction by an electric field or extraction lens into the second vacuum chamber 9. Ions preferably pass through an extraction cone 8 as they pass from the first vacuum chamber 6 into the second vacuum chamber 9.

An ion guide 11 is preferably provided in the second vacuum chamber 9 which preferably guides ions through the second vacuum chamber 9 and which preferably onwardly transmits ions to subsequent lower pressure vacuum chambers. The second vacuum chamber 9 is preferably pumped by a turbomolecular pump or a diffusion pump 10. Ions exiting the second vacuum chamber 9 preferably pass through a differential pumping aperture 12 into subsequent stages of the mass spectrometer.

According to an embodiment the backing pressure or the pressure in the first vacuum chamber 6 may be maintained, in use, in the range 5 to 9 mbar. The cone-gas cone 4 and the sampling cone 3 of the mass spectrometer may be maintained at a potential of 175 V.

The cone-gas cone 4 and the sampling cone 3 preferably comprise two co-axial cones which are preferably in direct contact with each other and which are preferably maintained at the same potential.

In order to test the performance of the sampling and extraction cones according to the preferred embodiment, a six component mixture of different compounds namely sulphadimethoxine, verapamil, caffeine, acetominophen, chloramphenicol and 17α hydroxyprogesterone were analysed. A liquid chromatography column (for chromatographic separation) with a tandem quadrupole mass spectrometer was used to produce the resulting data.

The six compound mixture was analysed by positive and negative ion Electrospray ionisation (ESI+/ESI−) using a liquid chromatography column (for chromatographic separation) with a tandem quadrupole mass spectrometer.

Data was acquired using: (i) a conventional stainless steel (SS) sampling and extraction cone; (ii) a sampling and extraction cone coated with titanium carbide (TiC) according to an embodiment of the present invention; and (iii) a cleaned stainless steel (SS) sampling and extraction cone.

The stainless steel and titanium carbide sampling and extraction cones were used for an extended time period to investigate their robustness characteristics.

Figure 3:
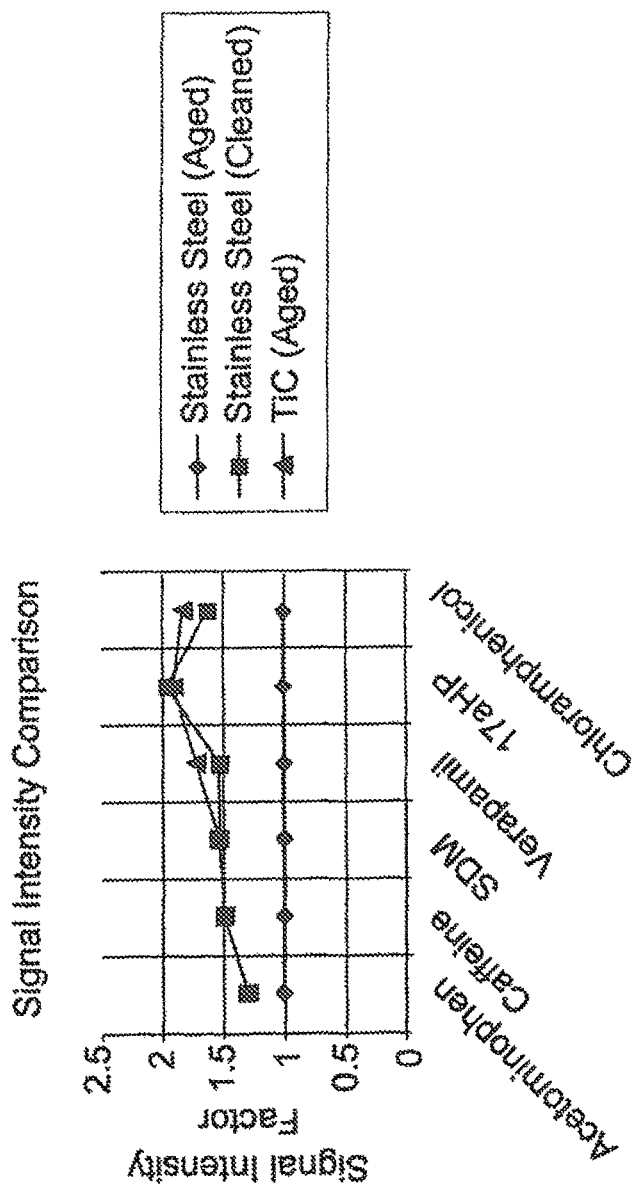
FIG. 3 shows the signal intensity factor difference for the data shown in FIG. 2.

FIGS. 2 and 3 show a comparison of the average intensities observed for each of the six compounds when using a used or aged stainless steel sampling and extraction cone set up, a used or aged sampling and extraction cone coated with titanium carbide (TiC) according to an embodiment of the present invention, and a recently cleaned stainless steel sampling and extraction cone.

FIG. 4 shows a comparison of the average areas observed for each of the six compounds when using a used or aged stainless steel sampling and extraction cone set up, a used or aged sampling and extraction cone set up coated with titanium carbide (TiC) according to an embodiment of the present invention and a recently cleaned stainless steel sampling and extraction cone.

From the above data it is apparent that as the stainless steel system ages, the response (sensitivity) and in addition the peak area of the analytes drops between 30-90% (depending upon the compound) with time. By contrast, the coated system according to the preferred embodiment maintains its sensitivity and hence the sample and extraction cone according to the preferred embodiment exhibits improved robustness.

The signal to noise response was also investigated and the data is shown in FIG. 5.

FIG. 5 shows the Signal to Noise factor of an aged or used stainless steel sample and extraction cone, an aged or used TiC sampling and extraction cone according to the preferred embodiment and a cleaned stainless steel sampling and extraction cone.

The results show that the S:N response for the aged stainless steel system is lower than that obtained from both the aged TiC sampling and extraction cone according to an embodiment of the present invention and the cleaned stainless steel sampling and extraction cone set up. This is due to the increased signal intensity obtained from the TiC and cleaned stainless steel sampling and extraction cones and also the lower noise produced from these systems compared to using an aged stainless steel sampling and extraction cone.

In summary, an improvement in robustness was observed using an extraction and sampling cone coated with titanium carbide according to an embodiment of the present invention. The coated surface maintains a higher signal intensity and lower noise response compared to the aged stainless steel environment for all compounds investigated. Cleaning the stainless steel surface regenerated the sample response and lowered the noise response resulting in equivalent results to the aged TIC.

The result of cleaning the TiC surface conferred no further improvement over that of the cleaned stainless steel system.

Though the above Description refers to a TiC-related example, more generally, some preferred coatings or layers include: 1) metallic carbide, such as TiC; 2) metallic boride; 3) ceramic or DLC, such as SiC; and 4) ion-implanted transition metals, such as ion-implanted titanium.

Although the present invention has been described with reference to the preferred embodiments, it will be understood by those skilled in the art that various changes in form and detail may be made without departing from the scope of the invention as set forth in the accompanying claims.

The invention claimed is:

1. A mass spectrometer comprising a sampling cone or a cone-gas cone, wherein said sampling cone or cone-gas cone comprises a first coating or surface on at least a portion of said sampling cone or cone-gas cone, wherein said first coating or surface comprises a metallic boride coating or surface.

2. A mass spectrometer as claimed in claim 1, wherein said sampling cone or said cone-gas cone is made from a material selected from the group consisting of: (i) stainless steel; (ii) a steel alloy comprising ≥11.5% chromium wt. %; (iii) an austenitic stainless steel; (iv) a ferritic stainless steel; (v) an austenitic-ferritic or duplex steel; (vi) titanium; (vii) a titanium alloy; (viii) a nickel-base alloy; (ix) a nickel-chromium alloy; and (x) a nickel-chromium alloy comprising ≥50.0% nickel wt. %.

3. A mass spectrometer as claimed in claim 1, wherein said sampling cone or said cone-gas cone comprises stainless steel or an alloy comprising:
(i) 0-0.01 wt. % carbon; (ii) 0.01-0.02 wt. % carbon; (iii) 0.02-0.03 wt. % carbon; (iv) 0.03-0.04 wt. % carbon; (v) 0.04-0.05 wt. % carbon; (vi) 0.05-0.06 wt. % carbon; (vii) 0.06-0.07 wt. % carbon; (viii) 0.07-0.08 wt. % carbon; or (ix) >0.08 wt % carbon.

4. A mass spectrometer as claimed in claim 1, wherein said sampling cone or said cone-gas cone comprises stainless steel or an alloy comprising:
(i) 0-0.01 wt. % nitrogen; (ii) 0.01-0.02 wt. % nitrogen; (iii) 0.02-0.03 wt. % nitrogen; (iv) 0.03-0.04 wt. % nitrogen; (v) 0.04-0.05 wt. % nitrogen; (vi) 0.05-0.06 wt. % nitrogen; (vii) 0.06-0.07 wt. % nitrogen; or (viii) >0.07 wt. % nitrogen.

5. A mass spectrometer as claimed in claim 1, wherein said sampling cone or said cone-gas cone comprises stainless steel or an alloy comprising:
(i) 0-0.1 wt. % nitrogen; (ii) 0.1-0.2 wt. % nitrogen; (iii) 0.2-0.3 wt. % nitrogen; (iv) 0.3-0.4 wt. % nitrogen; (v) 0.4-0.5 wt. % nitrogen; (vi) 0.5-0.6 wt. % nitrogen; (vii) 0.6-0.7 wt. % nitrogen; or (viii) >0.7 wt. % nitrogen.

6. A mass spectrometer as claimed in claim 1, wherein said sampling cone or said cone-gas cone comprises stainless steel or an alloy comprising:
(i) 12.0-13.0 wt. % chromium; (ii) 13.0-14.0 wt. % chromium; (iii) 14.0-15.0 wt. % chromium; (iv) 15.0-16.0 wt. % chromium; (v) 16.0-17.0 wt. % chromium; (vi) 17.0-18.0 wt. % chromium; (vii) 18.0-19.0 wt. % chromium; (viii) 19.0-20.0 wt. % chromium; (ix) 20.0-21.0 wt % chromium; (x) 21.0-22.0 wt. % chromium; (xi) 22.0-23.0 wt. % chromium; (xii) 23.0-24.0 wt. % chromium; (xiii) 24.0-25.0 wt. % chromium; (xiv) 25.0-26.0 wt. % chromium; (xv) 26.0-27.0 wt. % chromium; (xvi) 27.0-28.0 wt. % chromium; (xvii) 28.0-29.0 wt. % chromium; (xviii) 29.0-30.0 wt. % chromium; or (xix) >30.0 wt. % chromium.

7. A mass spectrometer as claimed in claim 1, wherein said sampling cone or said cone-gas cone comprises stainless steel or an alloy comprising:
(i) 0-1.0 wt. % nickel; (ii) 1.0-2.0 wt. % nickel; (iii) 2.0-3.0 wt. % nickel; (iv) 3.0-4.0 wt. % nickel; (v) 4.0-5.0 wt. % nickel; (vi) 5.0-6.0 wt. % nickel; (vii) 6.0-7.0 wt. % nickel; (viii) 7.0-8.0 wt. % nickel; (ix) 8.0-9.0 wt. % nickel; (x) 9.0-10.0 wt. % nickel; (xi) 10.0-11.0 wt. % nickel; (xii) 11.0-12.0 wt. % nickel; (xiii) 12.0-13.0 wt. % nickel; (xiv) 13.0-14.0 wt. % nickel; (xv) 14.0-15.0 wt. % nickel; (xvi) 15.0-16.0 wt. % nickel; (xvii) 16.0-17.0 wt. % nickel; (xviii) 17.0-18.0 wt. % nickel; (xix) 18.0-19.0 wt. % nickel; (xx) 19.0-20.0 wt. % nickel; (xxi) 20.0-21.0 wt. % nickel; (xxii) 21.0-22.0 wt. % nickel; (xxiii) 22.0-23.0 wt. % nickel; (xxiv) 23.0-24.0 wt. % nickel; (xxv) 24.0-25.0 wt. % nickel; (xxvi) 25.0-26.0 wt. % nickel; (xxvii) 26.0-27.0 wt. % nickel; (xxviii) 27.0-28.0 wt. % nickel; (xxix) 28.0-29.0 wt. % nickel; (xxx) 29.0-30.0 wt. % nickel; (xxxi) 30.0-31.0 wt. % nickel; (xxxii) 31.0-32.0 wt. % nickel; (xxxiii) 32.0-33.0 wt. % nickel; (xxxiv) 33.0-34.0 wt. % nickel; (xxxv) 34.0-35.0 wt. % nickel; (xxxvi) 35.0-36.0 wt. % nickel; (xxxvii) 36.0-37.0 wt. % nickel; (xxxviii) 37.0-38.0 wt. % nickel; (xxxix) 38.0-39.0 wt. % nickel; (xl) 39.0-40.0 wt. % nickel; (xli) 40.0-41.0 wt. % nickel; (xlii) 41.0-42.0 wt. % nickel; (xliii) 42.0-43.0 wt. % nickel; (xliv) 43.0-44.0 wt. % nickel; (xlv) 44.0-45.0 wt. % nickel; (xlvi) 45.0-46.0 wt. % nickel; or (xlvii) >46.0 wt. % nickel.

8. A mass spectrometer as claimed in claim 1, wherein said sampling cone or said cone-gas cone comprises stainless steel or an alloy comprising:
(i) 0-1.0 wt. % molybdenum; (ii) 1.0-2.0 wt. % molybdenum; (iii) 2.0-3.0 wt. % molybdenum; (iv) 3.0-4.0 wt. % molybdenum; (v) 4.0-5.0 wt. % molybdenum; (vi) 5.0-6.0 wt. % molybdenum; (vii) 6.0-7.0 wt. % molybdenum; (viii) 7.0-8.0 wt. % molybdenum; or (ix) >8.0 wt. % molybdenum.

9. A mass spectrometer as claimed in claim 1, wherein said sampling cone or said cone-gas cone comprises stainless steel or an alloy comprising:
(i) 0-1.0 wt. % copper; (ii) 1.0-2.0 wt. % copper; (iii) 2.0-3.0 wt. % copper; (iv) 3.0-4.0 wt. % copper; or (v) >4.0 wt. % copper.

10. A mass spectrometer as claimed in claim 1, wherein said sampling cone or said cone-gas cone comprises stainless steel or an alloy comprising:
(i) 0.01-1.0 wt. % X; (ii) 1.0-2.0 wt. % X; (iii) 2.0-3.0 wt. % X; (iv) 3.0-4.0 wt. % X; or (v) >4.0 wt. % X;
wherein X comprises cobalt or tantalum or aluminium or titanium or niobium or silicon or manganese or tungsten or phosphorous.

11. A mass spectrometer as claimed in claim 1, wherein said sampling cone or said cone-gas cone forms an interface between an atmospheric pressure ion source and a first vacuum chamber of said mass spectrometer.

12. A mass spectrometer as claimed in claim 1, wherein said sampling cone comprises a first or inner conical or frusto-conical body defining a first orifice or circular aperture through which ions pass in use.

13. A mass spectrometer as claimed in claim 12, wherein said first coating or surface is provided on:
(i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of said first or inner conical or frusto-conical body; or
(ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of said first or inner conical or frusto-conical body.

14. A mass spectrometer as claimed in claim 12, wherein said cone-gas cone comprises a second or outer conical or frusto-conical body defining a second orifice or annular aperture through which a cone gas emerges, in use, and wherein said second orifice or annular aperture substantially circumscribes at least part or substantially the whole of said first orifice or circular aperture.

15. A mass spectrometer as claimed in claim 14, wherein said first coating or surface is provided on:
(i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of said second or outer conical or frusto-conical body; or
(ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of said second or outer conical or frusto-conical body.

16. A mass spectrometer comprising an extraction cone, wherein said extraction cone comprises a first coating or surface provided on at least a portion of said extraction cone, wherein said first coating or surface comprises a metallic boride coating or surface.

17. A mass spectrometer as claimed in claim 16, wherein said extraction cone is made from a material selected from the group consisting of: (i) stainless steel; (ii) a steel alloy comprising ≥11.5% chromium wt. %; (iii) an austenitic stainless steel; (iv) a ferritic stainless steel; (v) an austenitic-ferritic or duplex steel; (vi) titanium; (vii) a titanium alloy; (viii) a nickel-base alloy; (ix) a nickel-chromium alloy; and (x) a nickel-chromium alloy comprising ≥50.0% nickel wt. %.

18. A mass spectrometer as claimed in claim 16, wherein said extraction cone comprises stainless steel or an alloy comprising:
(i) 0-0.01 wt. % carbon; (ii) 0.01-0.02 wt. % carbon; (iii) 0.02-0.03 wt. % carbon; (iv) 0.03-0.04 wt. % carbon; (v) 0.04-0.05 wt. % carbon; (vi) 0.05-0.06 wt. % carbon; (vii) 0.06-0.07 wt. % carbon; (viii) 0.07-0.08 wt. % carbon; or (ix) >0.08 wt. % carbon.

19. A mass spectrometer as claimed in claim 16, wherein said extraction cone comprises stainless steel or an alloy comprising:
(i) 0-0.01 wt. % nitrogen; (ii) 0.01-0.02 wt. % nitrogen; (iii) 0.02-0.03 wt. % nitrogen; (iv) 0.03-0.04 wt. % nitrogen; (v) 0.04-0.05 wt. % nitrogen; (vi) 0.05-0.06 wt. % nitrogen; (vii) 0.06-0.07 wt. % nitrogen; or (viii) >0.07 wt. % nitrogen.

20. A mass spectrometer as claimed in claim 16, wherein said extraction cone comprises stainless steel or an alloy comprising:
(i) 0-0.1 wt. % nitrogen; (ii) 0.1-0.2 wt. % nitrogen; (iii) 0.2-0.3 wt. % nitrogen; (iv) 0.3-0.4 wt. % nitrogen; (v) 0.4-0.5 wt. % nitrogen; (vi) 0.5-0.6 wt. % nitrogen; (vii) 0.6-0.7 wt. % nitrogen; or (viii) >0.7 wt. % nitrogen.

21. A mass spectrometer as claimed in claim 16, wherein said extraction cone comprises stainless steel or an alloy comprising:
(i) 12.0-13.0 wt. % chromium; (ii) 13.0-14.0 wt. % chromium; 0014.0-15.0 wt. % chromium; (iv) 15.0-16.0 wt. % chromium; (v) 16.0-17.0 wt. % chromium; (vi) 17.0-18.0 wt. % chromium; (vii) 18.0-19.0 wt % chromium; (viii) 19.0-20.0 wt. % chromium; (ix) 20.0-21.0 wt. % chromium; (x) 21.0-22.0 wt. % chromium; (xi) 22.0-23.0 wt. % chromium; (xii) 23.0-24.0 wt. % chromium; (xiii) 24.0-25.0 wt. % chromium; (xiv) 25.0-26.0 wt. % chromium; (xv) 26.0-27.0 wt. % chromium; (xvi) 27.0-28.0 wt. % chromium; (xvii) 28.0-29.0 wt. % chromium; (xviii) 29.0-30.0 wt. % chromium; or (xix) >30.0 wt. % chromium.

22. A mass spectrometer as claimed in claim 16, wherein said extraction cone comprises stainless steel or an alloy comprising:
(i) 0-1.0 wt. % nickel; (ii) 1.0-2.0 wt. % nickel; (iii) 2.0-3.0 wt. % nickel; (iv) 3.0-4.0 wt. % nickel; (v) 4.0-5.0 wt. % nickel; (vi) 5.0-6.0 wt. % nickel; (vii) 6.0-7.0 wt. % nickel; (viii) 7.0-8.0 wt. % nickel; (ix) 8.0-9.0 wt. % nickel; (x) 9.0-10.0 wt. % nickel; (xi) 10.0-11.0 wt. % nickel; (xii) 11.0-12.0 wt % nickel; (xiii) 12.0-13.0 wt. % nickel; (xiv) 13.0-14.0 wt % nickel; (xv) 14.0-15.0 wt. % nickel; (xvi) 15.0-16.0 wt. % nickel; (xvii) 16.0-17.0 wt. % nickel; (xviii) 17.0-18.0 wt. % nickel; (xix) 18.0-19.0 wt. % nickel; (xx) 19.0-20.0 wt. % nickel; (xxi) 20.0-21.0 wt. % nickel; (xxii) 21.0-22.0 wt. % nickel; (xxiii) 22.0-23.0 wt % nickel; (xxiv) 23.0-24.0 wt. % nickel; (xxv) 24.0-25.0 wt. % nickel; (xxvi) 25.0-26.0 wt. % nickel; (xxvii) 26.0-27.0 wt. % nickel; (xxviii) 27.0-28.0 wt. % nickel; (xxix) 28.0-29.0 wt. % nickel; (xxx) 29.0-30.0 wt. % nickel; (xxxi) 30.0-31.0 wt. % nickel; (xxxii) 31.0-32.0 wt. % nickel; (xxxiii) 32.0-33.0 wt. % nickel; (xxxiv) 33.0-34.0 wt. % nickel; (xxxv) 34.0-35.0 wt. % nickel; (xxxvi) 35.0-36.0 wt. % nickel; (xxxvii) 36.0-37.0 wt. % nickel; (xxxviii) 37.0-38.0 wt. % nickel; (xxxix) 38.0-39.0 wt. % nickel; (xl) 39.0-40.0 wt. % nickel; (xli) 40.0-41.0 wt. % nickel; (xlii) 41.0-42.0 wt. % nickel; (xliii) 42.0-43.0 wt. % nickel; (xliv) 43.0-44.0 wt. % nickel; (xlv) 44.0-45.0 wt. % nickel; (xlvi) 45.0-46.0 wt. % nickel; or (xlvii) >46.0 wt. % nickel.

23. A mass spectrometer as claimed in claim 16, wherein said extraction cone comprises stainless steel or an alloy comprising:
(i) 0-1.0 wt. % molybdenum; (ii) 1.0-2.0 wt. % molybdenum; (iii) 2.0-3.0 wt. % molybdenum; (iv) 3.0-4.0 wt. % molybdenum; (v) 4.0-5.0 wt. % molybdenum; (vi) 5.0-6.0 wt. % molybdenum; (vii) 6.0-7.0 wt. % molybdenum; (viii) 7.0-8.0 wt. % molybdenum; or (ix) >8.0 wt. % molybdenum.

24. A mass spectrometer as claimed in claim 16, wherein said extraction cone comprises stainless steel or an alloy comprising:
(i) 0-1.0 wt. % copper; (ii) 1.0-2.0 wt. % copper; (iii) 2.0-3.0 wt. % copper; (iv) 3.0-4.0 wt. % copper; or (v) >4.0 wt. % copper.

25. A mass spectrometer as claimed in claim 16, wherein said extraction cone comprises stainless steel or an alloy comprising:
(i) 0.01-1.0 wt. % X; (ii) 1.0-2.0 wt. % X; (iii) 2.0-3.0 wt. %); (iv) 3.0-4.0 wt. % X; or (v) >4.0 wt. % X;
wherein X comprises cobalt or tantalum or aluminium or titanium or niobium or silicon or manganese or tungsten or phosphorous.

26. A mass spectrometer as claimed in claim 16, wherein said extraction cone forms an interface between a first or further vacuum chamber of said mass spectrometer and a second or further vacuum chamber of said mass spectrometer.

27. A mass spectrometer as claimed in claim 16, wherein said extraction cone comprises a first or inner conical or frusto-conical body defining a first orifice or circular aperture through which ions pass in use.

28. A mass spectrometer as claimed in claim 27, wherein said first coating or surface is provided on:
(i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of said first or inner conical or frusto-conical body; or
(ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of said first or inner conical or frusto-conical body.

29. A mass spectrometer as claimed in claim 27, wherein said extraction cone further comprises a second or outer conical or frusto-conical body defining a second orifice or annular aperture, wherein said second orifice or annular aperture substantially circumscribes at least part or substantially the whole of said first orifice or circular aperture.

30. A mass spectrometer as claimed in claim 29, wherein said first coating or surface is provided on:
(i) at least 5%, 10%, 15%, 20%, 25%, 30%, 35%, 40%, 45%, 50%, 55%, 60%, 65%, 70%, 75%, 80%, 85%, 90%, 95% or 100% of an outer surface of said second or outer conical or frusto-conical body; or
(ii) at least 5%, 10%, 15%, 20%, 25%, 30%, 35%, 40%, 45%, 50%, 55%, 60%, 65%, 70%, 75%, 80%, 85%, 90%, 95% or 100% of an inner surface of said second or outer conical or frusto-conical body.

31. A mass spectrometer as claimed in claim 1, wherein said first coating or surface is selected from the group consisting of: (i) aluminium diboride, aluminium dodecaboride, $AlB_2$ or $AlB_{12}$; (ii) chromium diboride or $CrB_2$; (iii) copper boride; (iv) hafnium diboride or $HfB_2$; (v) iridium boride; (vi) iron boride, FeB or $Fe_2B$; (vii) manganese boride, manganese diboride, MnB or $MnB_2$; (viii) molybdenum diboride or $MoB_2$; (ix) nickel boride, NiB, $Ni_2B$ or $Ni_3B$; (x) niobium diboride or $NbB_2$; (xi) osmium boride; (xii) palladium boride; (xiii) platinum boride; (xiv) rhenium boride; (xv) rhodium boride; (xvi) ruthenium boride; (xvii) scandium boride or ScB; (xviii) silicon hexaboride, silicon tetraboride, $SiB_6$ or $SiB_4$; (xix) tantalum diboride or $TaB_2$; (xx) titanium diboride or $TiB_2$; (xxi) tungsten diboride or $WB_2$; (xxii) vanadium diboride or $VB_2$; (xxiii) yttrium boride; and (xxiv) zirconium diboride or $ZrB_2$.

32. A mass spectrometer as claimed in claim 1, wherein said first coating or surface comprises: (i) a transition metal boride or diboride; (ii) a boride or diboride alloy; or (iii) a mixed metal boride or diboride alloy.

33. A mass spectrometer as claimed in claim 1, wherein said first coating or surface has either:
(a) a resistivity selected from the group consisting of: (i) $<10^{-3}$ Ω-m; (ii) $<10^{-4}$ Ω-m; (iii) $<10^{-5}$ Ω-m; (v) $<10^{-6}$ Ω-m; (v) $<10^{-7}$ Ω-m; (vi) $10^{-3}$-$10^{-4}$ Ω-m; (vii) $10^{-4}$-$10^{-5}$ Ω-m; (viii) $10^{-5}$-$10^{-6}$ Ω-m; and (ix) $10^{-6}$-$10^{-7}$ Ω-m; or
(b) a Vickers hardness number or Vickers Pyramid Number (HV) selected from the group consisting of: (i) >1000; (ii) 1000-1100; (iii) 1100-1200; (iv) 1200-1300; (v) 1300-1400; (vi) 1400-1500; (vii) 1500-1600; (viii) 1600-1700; (ix) 1700-1800; (x) 1800-1900; (xi) 1900-2000; (xii) 2000-2100; (xiii) 2100-2200; (xiv) 2200-2300; (xv) 2300-2400; (xvi) 2400-2500; (xvii) 2500-2600; (xviii) 2600-2700; (xix) 2700-2800; (xx) 2800-2900; (xxi) 2900-3000; (xxii) 3000-3100; (xxiii) 3100-3200; (xxiv) 3200-3300; (xv) 3300-3400; (xvi) 3400-3500; and (xvii) >3500, wherein said Vickers hardness number or Vickers Pyramid Number is determined at a load of 30, 40, 50, 60 or 70 kg; or
(c) a Vickers microhardness selected from the group consisting of: (i) >1000 kg/mm; (ii) 1000-1100 kg/mm; (iii) 1100-1200 kg/mm; (iv) 1200-1300 kg/mm; (v) 1300-1400 kg/mm; (vi) 1400-1500 kg/mm; (vii) 1500-1600 kg/mm; (viii) 1600-1700 kg/mm; (ix) 1700-1800 kg/mm; (x) 1800-1900 kg/mm; (xi) 1900-2000 kg/mm; (xii) 2000-2100 kg/mm; (xiii) 2100-2200 kg/mm; (xiv)

2200-2300 kg/mm; (xv) 2300-2400 kg/mm; (xvi) 2400-2500 kg/mm; (xvii) 2500-2600 kg/mm; (xviii) 2600-2700 kg/mm; (xix) 2700-2800 kg/mm; (xx) 2800-2900 kg/mm; (xxi) 2900-3000 kg/mm; (xxii) 3000-3100 kg/mm; (xxiii) 3100-3200 kg/mm; (xxiv) 3200-3300 kg/mm; (xv) 3300-3400 kg/mm; (xvi) 3400-3500 kg/mm; and (xvii) >3500 kg/mm, or (d) a thickness selected from the group consisting of: (i) <1 µm; (ii) 1-2 µm; (iii) 2-3 µm; (iv) 3-4 µm; (v) 4-5 µm; (vi) 5-6 µm; (vii) 6-7 µm; (viii) 7-8 µm; (ix) 8-9 µm; (x) 9-10 µm; (xi) >10 µm; or (e) a density selected from the group consisting of: (i) <3.0 g cm$^{-3}$; (ii) 3.0-3.5 g cm$^{-3}$; (iii) 3.5-4.0 g cm$^{-3}$; (iv) 4.0-4.5 g cm$^{-3}$; (v) 4.5-5.0 g cm$^{-3}$; (vi) 5.0-5.5 g cm$^{-3}$; (vii) 5.5-6.0 g cm$^{-3}$; (viii) 6.0-6.5 g cm$^{-3}$; (ix) 6.5-7.0 g cm$^{-3}$; (x) 7.0-7.5 g cm$^{-3}$; (xi) 7.5-8.0 g cm$^{-3}$; (xii) 8.0-8.5 g cm$^{-3}$; (xiii) 8.5-9.0 g cm$^{-3}$; (xiv) 9.0-9.5 g cm$^{-3}$; (xv) 9.5-10.0 g cm$^{-3}$; (xvi) 10.0-10.5 g cm$^{-3}$; (xvii) 10.5-11.0 g cm$^{-3}$; (xviii) 11.0-11.5 g cm$^{-3}$; (xix) 11.5-12.0 g cm$^{-3}$; (xx) 12.0-12.5 g cm$^{-3}$; (xxi) 12.5-13.0 g cm$^{-3}$; (xxii) 13.0-13.5 g cm$^{-3}$; (xxiii) 13.5-14.0 g cm$^{-3}$; (xxiv) 14.0-14.5 g cm$^{-3}$; (xxv) 14.5-15.0 g cm$^{-3}$; (xxvi) 15.0-15.5 g cm$^{-3}$; (xxvii) 15.5-16.0 g cm$^{-3}$; (xxviii) 16.0-16.5 g cm$^{-3}$; (xxix) 16.5-17.0 g cm$^{-3}$; (xxx) 17.0-17.5 g cm$^{-3}$; (xxxi) 17.5-18.0 g cm$^{-3}$; (xxxii) 1810-18.5 g cm$^{-3}$; (xxxiii) 18.5-19.0 g cm$^{-3}$; (xxxiv) 19.0-19.5 g cm$^{-3}$; (xxxv) 19.5-20.0 g cm$^{-3}$; and (xxxvi) >20.0 g cm$^{-3}$; or (f) a coefficient of friction selected from the group consisting of: (i) <0.01; (ii) 0.01-0.02; (iii) 0.02-0.03; (iv) 0.03-0.04; (v) 0.04-0.05; (vi) 0.05-0.06; (vii) 0.06-0.07; (viii) 0.07-0.08; (ix) 0.08-0.09; (x) 0.09-0.10; and (xi) >0.1.

34. A method of mass spectrometry comprising:
passing ions through a sampling cone or a cone-gas cone of a mass spectrometer, wherein said sampling cone or said cone-gas cone comprises a first coating or surface provided on at least a portion of said sampling cone or said cone-gas cone, wherein said first coating or surface comprises a metallic boride coating or surface.

35. A method of mass spectrometry comprising:
passing ions through an extraction cone of a mass spectrometer, wherein said extraction cone comprises a first coating or surface provided on at least a portion of said extraction cone, wherein said first coating or surface comprises a metallic boride coating or surface.

36. A method of making a sampling cone or a cone-gas cone for a mass spectrometer comprising:
depositing, sputtering or forming a first coating or surface on at least a portion of a sampling cone or a cone-gas cone of a mass spectrometer, wherein said first coating or surface comprises a metallic boride coating or surface.

37. A method of making an extraction cone for a mass spectrometer comprising:
depositing, sputtering or forming a first coating or surface on at least a portion of an extraction cone of a mass spectrometer, wherein said first coating or surface comprises a metallic boride coating or surface.

38. A method as claimed in claim 36, wherein said step of depositing, sputtering or forming said first coating or surface comprises using a method selected from the group consisting of: (i) magnetron sputtering; (ii) closed field unbalanced magnetron sputter ion plating; (iii) electroplating; (iv) thermal spray coating; (v) vapour deposition; (vi) Chemical Vapour Deposition ("CVD"); (vii) combustion torch/flame spraying; (viii) electric arc spraying; (ix) plasma spraying; (x) ion plating; (xi) ion implantation; (xii) sputtering; (xiii) sputter deposition; (xiv) laser surface alloying; (xv) Physical Vapour Deposition ("PVD"); (xvi) plasma-based ion plating; (xvii) gas plasma discharge sputtering; (xviii) laser cladding; (xix) plasma enhanced Chemical Vapour Deposition; (xx) low pressure Chemical Vapour Deposition; (xxi) laser enhanced Chemical Vapour Deposition; (xxii) active reactive evaporation; (xxiii) Pulsed Laser Deposition ("PLD"); (xxiv) RF-sputtering; (xxv) Ion-Beam Sputtering ("IBS"); (xxvi) reactive sputtering; (xxvii) Ion-Assisted Deposition ("IAD"); (xxviii) high target utilisation sputtering; (xxix) High Power Impulse Magnetron Sputtering ("HIPIMS"); and (xxx) DC-sputtering.

39. A method as claimed in claim 34, wherein said first coating or surface is selected from the group consisting of: (i) aluminium diboride, aluminium dodecaboride, $AlB_2$ or $AlB_{12}$; (ii) chromium diboride or $CrB_2$; (iii) copper boride; (iv) hafnium diboride or $HfB_2$; (v) iridium boride; (vi) iron boride, FeB or $Fe_2B$; (vii) manganese boride, manganese diboride, MnB or $MnB_2$; (viii) molybdenum diboride or $MoB_2$; (ix) nickel boride, NiB, $Ni_2B$ or $Ni_3B$; (x) niobium diboride or $NbB_2$; (xi) osmium boride; (xii) palladium boride; (xiii) platinum boride; (xiv) rhenium boride; (xv) rhodium boride; (xvi) ruthenium boride; (xvii) scandium boride or ScB; (xviii) silicon hexaboride, silicon tetraboride, $SiB_6$ or $SiB_4$; (xix) tantalum diboride or $TaB_2$; (xx) titanium diboride or $TiB_2$; (xxi) tungsten diboride or $WB_2$; (xxii) vanadium diboride or $VB_2$; (xxiii) yttrium boride; and (xxiv) zirconium diboride or $ZrB_2$.

40. A method as claimed in claim 34, wherein said first coating or surface comprises: (i) a transition metal boride or diboride; (ii) a boride or diboride alloy; or (iii) a mixed metal boride or diboride alloy.

* * * * *